United States Patent
Suda

(10) Patent No.: US 7,847,843 B2
(45) Date of Patent: Dec. 7, 2010

(54) IMAGE SENSING APPARATUS AND ITS CONTROL METHOD, CONTROL PROGRAM, AND STORAGE MEDIUM FOR CORRECTING POSITION DEVIATION OF IMAGES

(75) Inventor: Yasuo Suda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 898 days.

(21) Appl. No.: 11/217,467

(22) Filed: Sep. 2, 2005

(65) Prior Publication Data

US 2006/0001765 A1   Jan. 5, 2006

Related U.S. Application Data

(63) Continuation of application No. 10/028,448, filed on Oct. 25, 2001, now Pat. No. 7,262,799.

(30) Foreign Application Priority Data

Oct. 25, 2000   (JP) .............................. 2000-325588

(51) Int. Cl.
*H04N 9/093* (2006.01)
*H04N 3/14* (2006.01)

(52) U.S. Cl. .................... 348/263; 348/340; 348/360

(58) Field of Classification Search ................. 348/262, 348/263, 265, 279–282, 348, 311
See application file for complete search history.

(56) References Cited

U.S. PATENT DOCUMENTS 3,971,065 A   7/1976   Bayer 4,641,352 A   2/1987   Fenster et al.
4,685,146 A   8/1987   Fenster et al.

(Continued)

FOREIGN PATENT DOCUMENTS

JP   05-88445   1/1986

(Continued)

OTHER PUBLICATIONS

The above references were cited in a Feb. 23, 2007 US Office Action that issued in related U.S. Appl. No. 10/028,448.

*Primary Examiner*—David L Ometz
*Assistant Examiner*—Carramah J Quiett
(74) *Attorney, Agent, or Firm*—Cowan, Liebowitz & Latman, P.C.

(57) ABSTRACT

This invention has as its object to provide an image sensing apparatus which can satisfactorily correct misregistration among images, and can composite the images. To achieve this object, an image sensing apparatus includes: a plurality of apertures that receives external light from different positions; a plurality of image sensing units that outputs image signals obtained by independently receiving light that comes from an identical position of an object and is received via the plurality of apertures, and independently extracting predetermined color components for each received light; and a signal processing device that forms a signal that outputs an object image by mixing the image signals output from the plurality of image sensing units. When it is determined that a predetermined position deviation occurs between the image signals upon forming the signal that outputs the object image, the signal processing device corrects the predetermined position deviation by a signal process, and forms the signal that outputs the object image.

12 Claims, 27 Drawing Sheets

U.S. PATENT DOCUMENTS

| | | |
|---|---|---|
| 4,903,067 A | 2/1990 | Murayama et al. |
| 5,081,525 A | 1/1992 | Akiyama et al. |
| 5,398,058 A | 3/1995 | Hattori |
| 5,523,786 A | 6/1996 | Parulski |
| 5,726,709 A | 3/1998 | Kinoshita et al. |
| 5,949,483 A | 9/1999 | Fossum et al. |
| 5,977,535 A | 11/1999 | Rostoker |
| 6,137,634 A * | 10/2000 | Li ................................ 359/619 |
| 6,148,152 A * | 11/2000 | Cazier et al. ................... 396/97 |
| 6,337,713 B1 | 1/2002 | Sato |
| 6,611,289 B1 | 8/2003 | Yu et al. |
| 6,665,010 B1 | 12/2003 | Morris et al. |
| 6,765,617 B1 | 7/2004 | Tangen et al. |
| 6,771,314 B1 | 8/2004 | Bawolek et al. |
| 6,952,228 B2 | 10/2005 | Yoneda et al. |
| 7,123,298 B2 | 10/2006 | Schroeder et al. |
| 7,139,028 B2 | 11/2006 | Itano et al. |
| 7,199,348 B2 | 4/2007 | Olsen et al. |
| 2001/0030697 A1 | 10/2001 | Dischert et al. |
| 2002/0089596 A1 | 7/2002 | Suda |
| 2002/0113888 A1 | 8/2002 | Sonoda et al. |
| 2006/0001765 A1 | 1/2006 | Suda |

FOREIGN PATENT DOCUMENTS

| | | |
|---|---|---|
| JP | A5-191811 | 7/1993 |
| JP | 06-006680 | 1/1994 |
| JP | A6-225187 | 8/1994 |
| JP | A6-303622 | 10/1994 |
| JP | A7-87385 | 3/1995 |
| JP | 08-116490 | 5/1996 |
| JP | 10-289316 | 10/1998 |
| WO | WO 99/26419 | 5/1999 |

* cited by examiner

F I G. 3
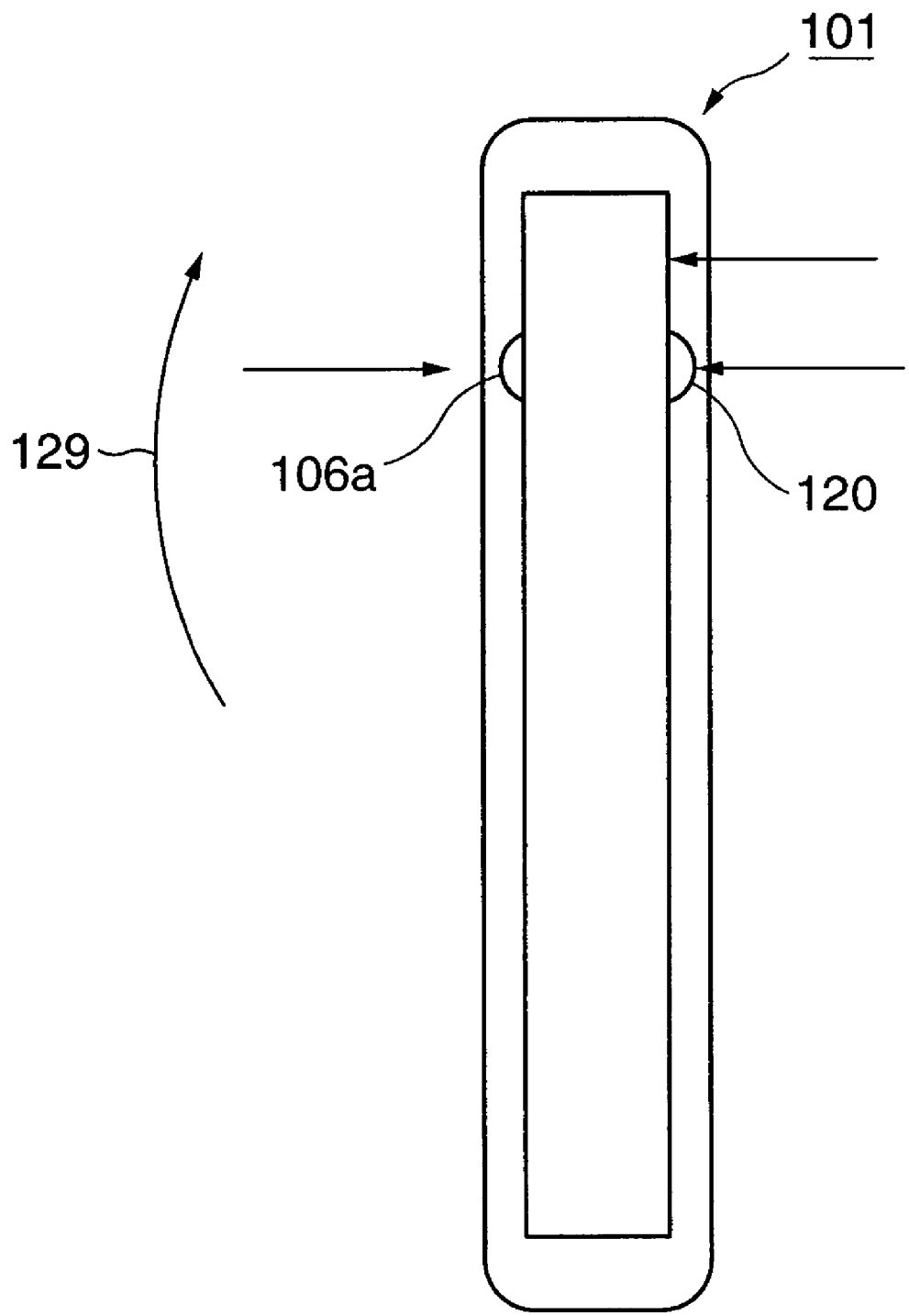

F I G. 16
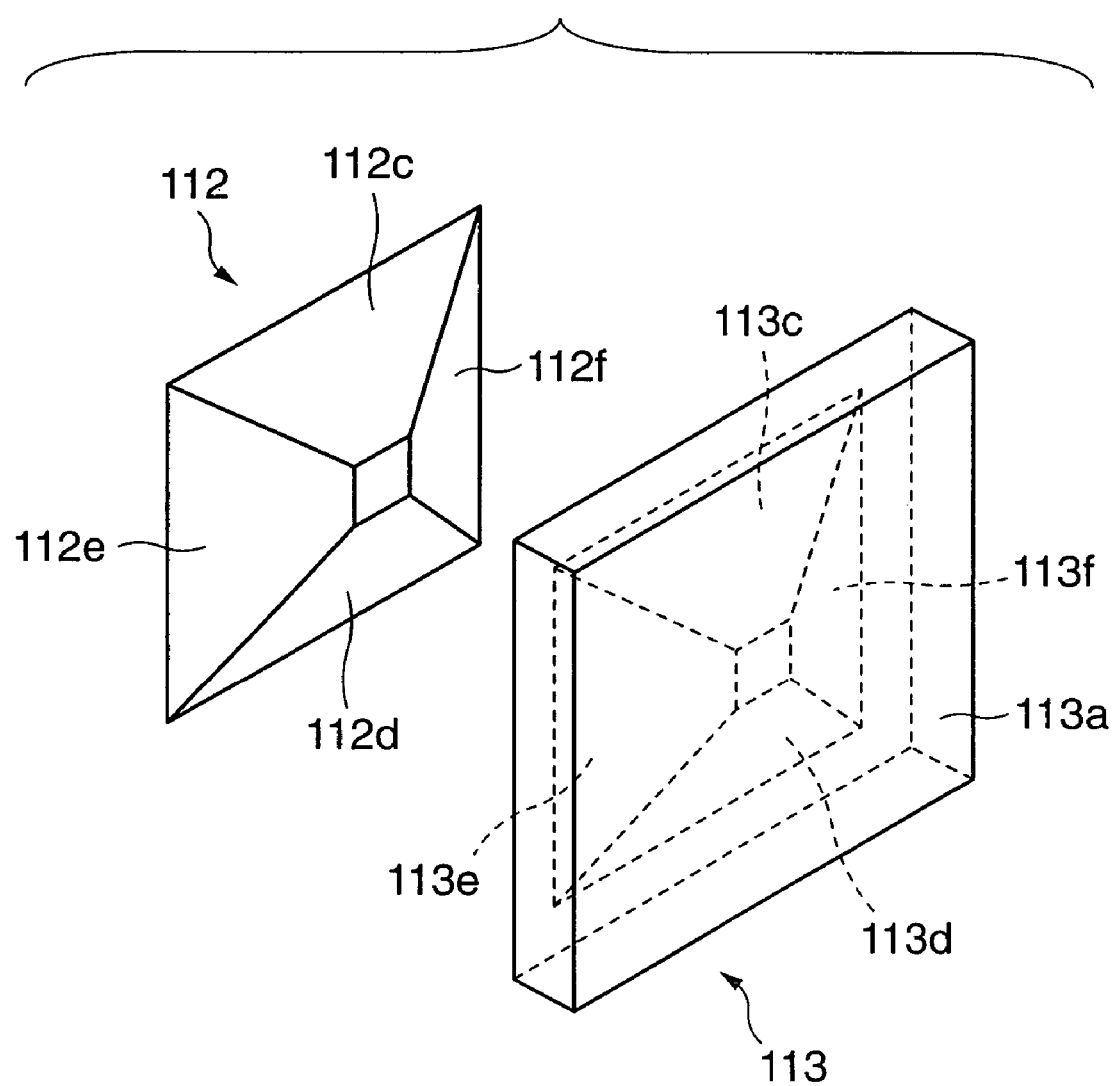

F I G. 24
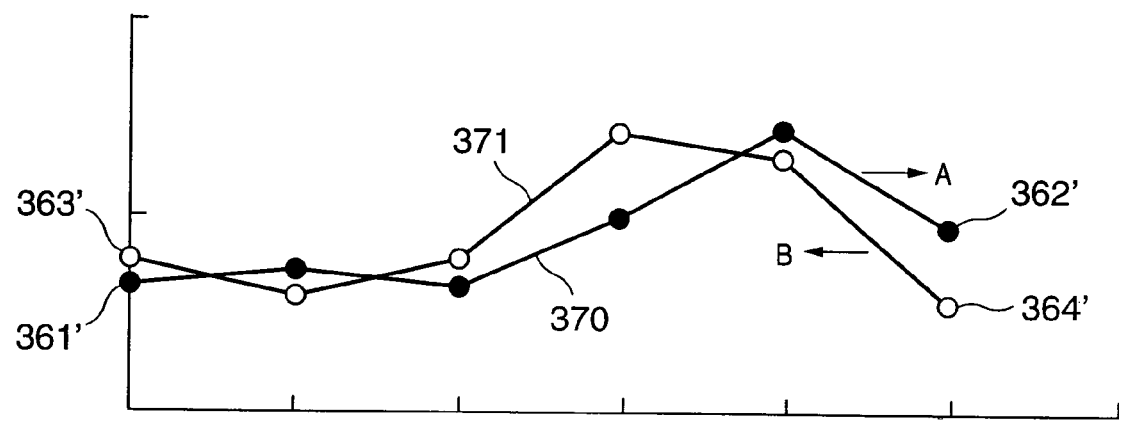

F I G. 25
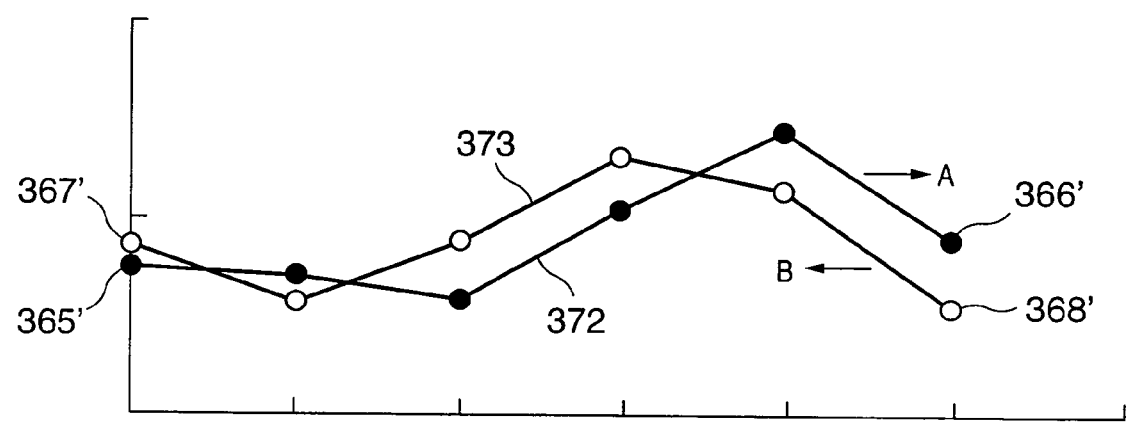

IMAGE SENSING APPARATUS AND ITS CONTROL METHOD, CONTROL PROGRAM, AND STORAGE MEDIUM FOR CORRECTING POSITION DEVIATION OF IMAGES

This is a divisional of prior application Ser. No. 10/028,448, filed on Oct. 25, 2001, now pending, which is incorporated herein by reference in its entirety.

FIELD OF THE INVENTION

The present invention relates to a compact image sensing apparatus such as a digital still camera, video movie camera, and the like that adopt a solid-state image sensing element, its control method, a control program, and a storage medium.

BACKGROUND OF THE INVENTION

In a digital color camera, a solid-state image sensing element such as a CCD, CMOS sensor, or the like is exposed to an object image for a desired period of time in synchronism with pressing of a release button, and an image signal for one frame obtained by exposure undergoes a predetermined process such as a YC process or the like to obtain an image signal of a predetermined format. Digital image signals that represent sensed images are recorded in a semiconductor memory for respective images. The recorded image signals are solely or sequentially read out as needed to reproduce displayable or printable signals, which are output to and displayed on a monitor or the like.

The present applicant proposed a technique for generating R, G, and B images using a three- or four-lens optical system, and compositing these images to obtain a video signal. This technique is very effective for implementing a low-profile image sensing system.

However, in the method using the three- or four-lens optical system, R, G, and B images suffer misregistration resulting from the disparity of the optical system.

Misregistration of R, G, and B images results in unwanted color misregistration and low sharpness of an output image.

Techniques for obtaining a composite image by executing position correction based on a pair of images with disparity are known in Japanese Patent Laid-Open Nos. 6-6680 and 8-116490, but they are not directed to independently obtaining R, G, and B images.

SUMMARY OF THE INVENTION

It is an object of the present invention to provide an image sensing apparatus which can composite images by satisfactorily correcting their misregistration and its control method, a control program, and a storage medium.

In order to solve the aforementioned problems and to achieve the above object, an image sensing apparatus according to the first aspect of the present invention is characterized by the following arrangement.

That is, an image sensing apparatus comprises a plurality of apertures that receives external light from different positions, a plurality of image sensing units that outputs image signals obtained by independently receiving light that comes from an identical position of an object and is received via the plurality of apertures, and independently extracting predetermined color components for each received light, and a signal processing device that forms a signal that outputs an object image by mixing the image signals output from the plurality of image sensing units, wherein upon forming the signal that outputs the object image, the signal processing device determines a position deviation state, which occurs between the image signals, and corrects the position deviation state by a signal process, and forms the signal that outputs the object image.

An image sensing apparatus according to the second aspect of the present invention is characterized by the following arrangement.

That is, an image sensing apparatus comprises an image sensing element having a plurality of image sensing areas, a photographing optical system that forms object images on the plurality of image sensing areas via a plurality of imaging systems corresponding to the plurality of image sensing areas, a temperature measuring device that detects a temperature near the image sensing element, and a signal processing device that forms a signal that outputs an object image by mixing image signals output from the plurality of image sensing areas of the image sensing element, wherein the signal processing device corrects a position deviation between the image signals in accordance with an output from the temperature measuring device upon forming the signal that outputs the object image, and forms the signal that outputs the object image.

An image sensing apparatus according to the third aspect of the present invention is characterized by the following arrangement.

That is, an image sensing apparatus comprises an image sensing element having a plurality of image sensing areas, a photographing optical system that forms object images on the plurality of image sensing areas via a plurality of imaging systems corresponding to the plurality of image sensing areas, and a signal processing device that forms a signal that outputs an object image by mixing image signals output from the plurality of image sensing areas of the image sensing element, wherein the signal processing device corrects a position deviation between the image signals in accordance with an object distance upon forming the signal that outputs the object image, and forms the signal that outputs the object image.

An image sensing apparatus according to the fourth aspect of the present invention is characterized by the following arrangement.

That is, an image sensing apparatus comprises an image sensing element having a plurality of image sensing areas, a photographing optical system that forms object images on the plurality of image sensing areas via a plurality of imaging systems corresponding to the plurality of image sensing areas, and a signal processing device that forms a signal that outputs an object image by mixing image signals output from the plurality of image sensing areas of the image sensing element, wherein the signal processing device corrects a position deviation between the image signals in response to setting of a near-distance photographing mode upon forming the signal that outputs the object image, and forms the signal that outputs the object image.

An image sensing apparatus according to the fifth aspect of the present invention is characterized by the following arrangement.

That is, an image sensing apparatus comprises an image sensing element having first and second image sensing areas with substantially the same size on a single plane, a photographing optical system that respectively forms first and second object images on the first and second image sensing areas, and a signal processing device that processes an output signal from the image sensing element, and each of the first and second image sensing areas has a matrix of a plurality of pixels arranged at a pitch a in the horizontal direction and a pitch b in the vertical direction on a light-receiving surface, the first and second image sensing areas have a positional relationship in which the first and second image sensing areas are separated a×h×c in the horizontal direction and b×c in the vertical direction (where h is a positive integer), the image sensing element forms first and second images which are formed to have an identical spectral distribution and have substantially the same fields of view, and the signal processing device generates a composite image signal based on the first and second images.

A control method of an image sensing apparatus according to the first aspect of the present invention is characterized by the following arrangement.

That is, a method of controlling an image sensing apparatus, which comprises a plurality of apertures for receiving external light from different positions, and a plurality of image sensing units for outputting image signals obtained by independently receiving light that comes from an identical position of an object and is received via the plurality of apertures, and independently extracting predetermined color components for each received light, comprises the step of forming a signal that outputs an object image by mixing the image signals output from the plurality of image sensing units, and correcting, when it is determined that a predetermined position deviation occurs between the image signals upon forming the signal that outputs the object image, the predetermined position deviation by a signal process and forming the signal that outputs the object image.

A control method of an image sensing apparatus according to the second aspect of the present invention is characterized by the following arrangement.

That is, a method of controlling an image sensing apparatus, which comprises an image sensing element having a plurality of image sensing areas, a photographing optical system for forming object images on the plurality of image sensing areas via a plurality of imaging systems corresponding to the plurality of image sensing areas, and a temperature measuring device for detecting a temperature near the image sensing element, comprises the step of forming a signal that outputs an object image by mixing image signals output from the plurality of image sensing areas of the image sensing element, and correcting a position deviation between the image signals in accordance with an output from the temperature measuring device upon forming the signal that outputs the object image and forming the signal that outputs the object image.

A control method of an image sensing apparatus according to the third aspect of the present invention is characterized by the following arrangement.

That is, a method of controlling an image sensing apparatus, which comprises an image sensing element having a plurality of image sensing areas, and a photographing optical system for forming object images on the plurality of image sensing areas via a plurality of imaging systems corresponding to the plurality of image sensing areas, comprises the step of forming a signal that outputs an object image by mixing image signals output from the plurality of image sensing areas of the image sensing element, and correcting a position deviation between the image signals in accordance with an object distance upon forming the signal that outputs the object image, and forming the signal that outputs the object image.

A control method of an image sensing apparatus according to the fourth aspect of the present invention is characterized by the following arrangement.

That is, a method of controlling an image sensing apparatus, which comprises an image sensing element having a plurality of image sensing areas, and a photographing optical system for forming object images on the plurality of image sensing areas via a plurality of imaging systems corresponding to the plurality of image sensing areas, comprises the step of forming a signal that outputs an object image by mixing image signals output from the plurality of image sensing areas of the image sensing element, and correcting a position deviation between the image signals in response to setting of a near-distance photographing mode upon forming the signal that outputs the object image, and forming the signal that outputs the object image.

A control program according to the first aspect of the present invention is characterized by the following arrangement.

That is, a control program for controlling an image sensing apparatus, which comprises a plurality of apertures for receiving external light from different positions, and a plurality of image sensing units for outputting image signals obtained by independently receiving light that comes from an identical position of an object and is received via the plurality of apertures, and independently extracting predetermined color components for each received light, comprises a code of the step of forming a signal that outputs an object image by mixing the image signals output from the plurality of image sensing units, and correcting, when it is determined that a predetermined position deviation occurs between the image signals upon forming the signal that outputs the object image, the predetermined position deviation by a signal process, and forming the signal that outputs the object image.

A control program according to the second aspect of the present invention is characterized by the following arrangement.

That is, a control program for controlling an image sensing apparatus, which comprises an image sensing element having a plurality of image sensing areas, a photographing optical system for forming object images on the plurality of image sensing areas via a plurality of imaging systems corresponding to the plurality of image sensing areas, and a temperature measuring device for detecting a temperature near the image sensing element, comprises a code of the step of forming a signal that outputs an object image by mixing image signals output from the plurality of image sensing areas of the image sensing element, and correcting a position deviation between the image signals in accordance with an output from the temperature measuring device upon forming the signal that outputs the object image, and forming the signal that outputs the object image.

A control program according to the third aspect of the present invention is characterized by the following arrangement.

That is, a control program for controlling an image sensing apparatus, which comprises an image sensing element having a plurality of image sensing areas, and a photographing optical system for forming object images on the plurality of image sensing areas via a plurality of imaging systems corresponding to the plurality of image sensing areas, comprises a code of the step of forming a signal that outputs an object image by mixing image signals output from the plurality of image sensing areas of the image sensing element, and correcting a position deviation between the image signals in accordance with an object distance upon forming the signal that outputs the object image, and forming the signal that outputs the object image.

A control program according to the fourth aspect of the present invention is characterized by the following arrangement.

That is, a control program for controlling an image sensing apparatus, which comprises an image sensing element having a plurality of image sensing areas, and a photographing optical system for forming object images on the plurality of image sensing areas via a plurality of imaging systems corresponding to the plurality of image sensing areas, comprises a code of the step of forming a signal that outputs an object image by mixing image signals output from the plurality of image sensing areas of the image sensing element, and correcting a position deviation between the image signals in response to setting of a near-distance photographing mode upon forming the signal that outputs the object image, and forming the signal that outputs the object image.

A storage medium according to the present invention is characterized by the following arrangement.

That is, the control program is computer-readably stored.

Other objects and advantages besides those discussed above shall be apparent to those skilled in the art from the description of a preferred embodiment of the invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIG. 3 is a side view of the camera viewed from the left side in FIG. 2;

FIG. 16 is a perspective view of first and second prisms which form a viewfinder;

FIG. 24 is a graph showing signals of pixel sequences of two image sensing areas;

FIG. 25 is a graph showing signals of pixel sequences of two image sensing areas;

DETAILED DESCRIPTION OF THE PREFERRED EMBODIMENTS

Preferred embodiments of the present invention will be described in detail hereinafter with reference to the accompanying drawings.

First Embodiment

Figure 2:
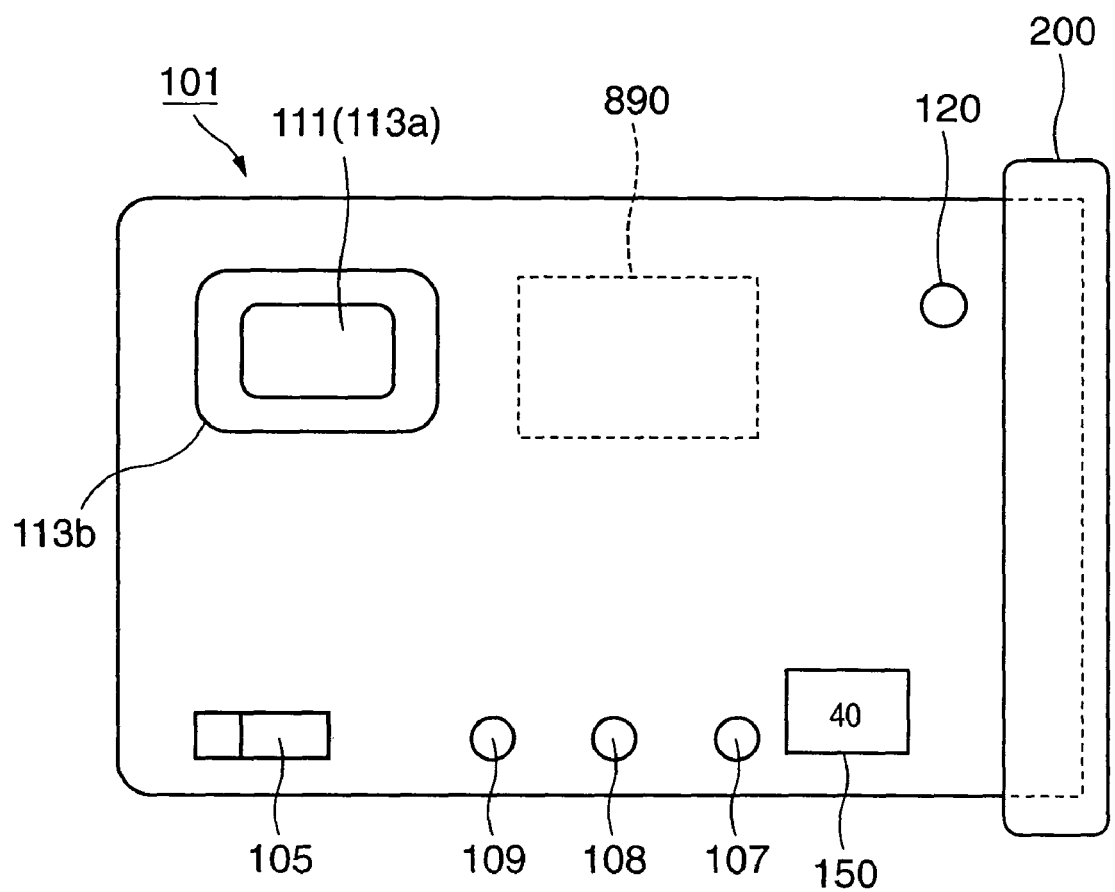
FIG. 2 is a rear view of the digital color camera.
Figure 4:
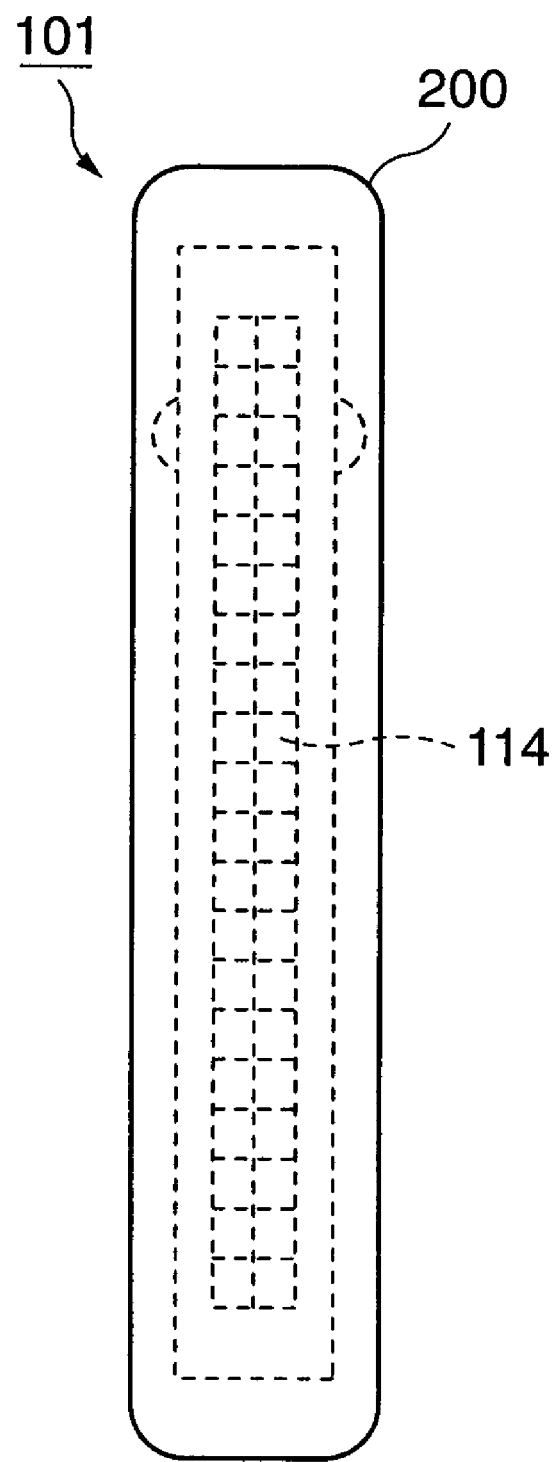
FIG. 4 is a side view of the camera viewed from the right side in FIG. 2.

FIGS. 2, 3, and 4 show the outer appearance of a digital color camera according to the first embodiment of the present invention, in which FIG. 2 is a rear view of the camera, FIG. 3 is a side view of the camera viewed from the left side in FIG. 2, and FIG. 4 is a side view of the camera viewed from the right side in FIG. 2.

Referring to FIGS. 2, 3, and 4, reference numeral 101 denotes a card-shaped camera main body; 105, a main switch; 106, a release button (also shown in FIG. 1); 107, 108, and 109, switches with which the user sets the camera state; and 150, an indicator of the remaining photographable count. Reference numeral 111 denotes a viewfinder eyepiece window, from which object light that has entered the viewfinder exits. Reference numeral 114 denotes a standardized connection terminal which is connected to an external computer or the like to exchange data; 200, a contact protection cap which also serves as a grip; 120, a projection which is formed coaxial with the release button 106 arranged on the front surface of the camera; and 890, an image sensing system which is incorporated in the camera. The contact protection cap 200 is formed of a soft resin or rubber.

The camera main body 101 may have the same size as a PC card and may be inserted into a personal computer. In this case, the camera main body 101 has a length of 85.6 mm, a width of 54.0 mm, and a thickness of 3.3 mm (PC card standard Type 1) or a thickness of 5.0 mm (PC card standard Type 2).

Figure 1:
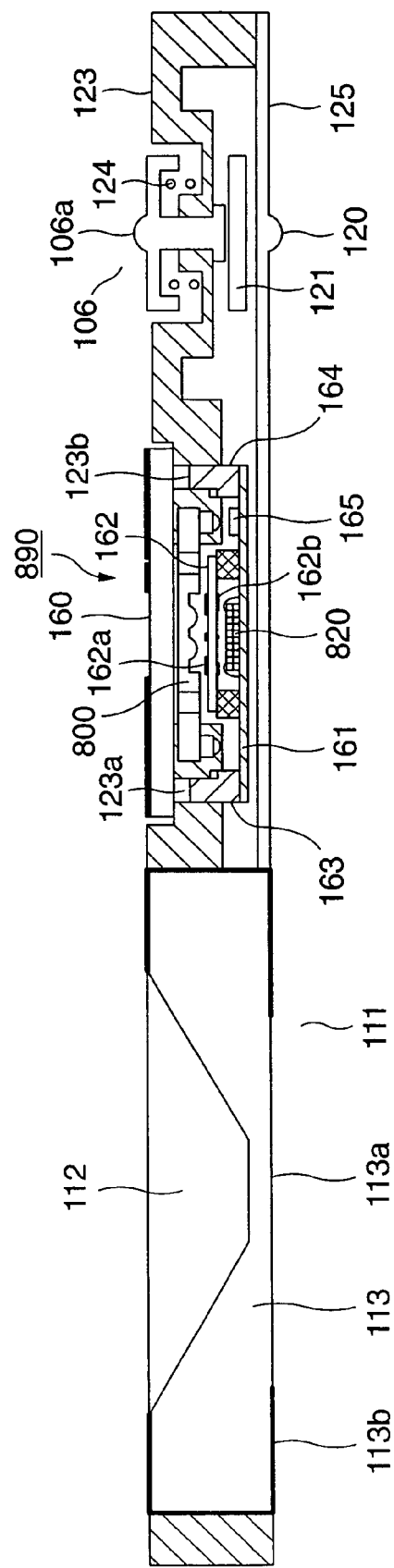
FIG. 1 is a sectional view of a digital color camera.

FIG. 1 is a sectional view of the digital color camera taken along a plane that passes through the release button 106, image sensing system 890, and viewfinder eyepiece window 111. Referring to FIG. 1, reference numeral 123 denotes a housing for holding the respective building components of the camera; 125, a back cover; 890, an image sensing system; 121, a switch which is turned on upon pressing of the release button 106; and 124, a coil spring that biases the release button 106 in a projecting direction. The switch 121 comprises a first-stage circuit which is closed when the release button 106 is pressed to its half-stroke position, and a second-stroke circuit which is closed when the release button 106 is pressed to its full-stroke position.

Reference numerals 112 and 113 denote first and second prisms which form a viewfinder optical system. The first and second prisms 112 and 113 are formed of a transparent material such as an acrylic resin or the like, and have an identical refractive index. Also, these prisms 112 and 113 are solid so that light rays propagate straight through their interiors. A light-shielding printed region 113b is formed on the peripheral portion of an object light exit surface 113a of the second prism 113, thus limiting the passing range of viewfinder exit light. This printed region also extends to the side surfaces of the second prism 113 and to portions facing the object light exit surface 113a.

The image sensing system 890 is constructed by attaching a protection glass 160, photographing lens 800, sensor board 161, and relay members 163 and 164 used to adjust the sensor position to a housing 123. On the sensor board 161, a solid-state image sensing element 820, sensor cover glass 162, and temperature sensor 165 as temperature measurement means are attached, and a stop 810 (to be described later) is adhered to the photographing lens 800. After the relay members 163 and 164 are movably fitted into through holes 123a and 123b of the housing and the photographing lens 800 and the solid-state image sensing element 820 are adjusted to have an appropriate positional relationship, these members are adhered to the sensor board 161 and housing 123.

Furthermore, the protection glass 160 and sensor cover glass 162 have light-shielding printed regions except for an effective portion so as to reduce light, which comes from a range outside the image sensing range and enters the solid-state image sensing element 820, as much as possible. In FIG. 1, reference numerals 162a and 162b denote printed regions. Also, these glasses have an antireflection coat except for the printed regions to avoid ghost from being produced.

Details of the image sensing system 890 will be described below.

Figure 5:
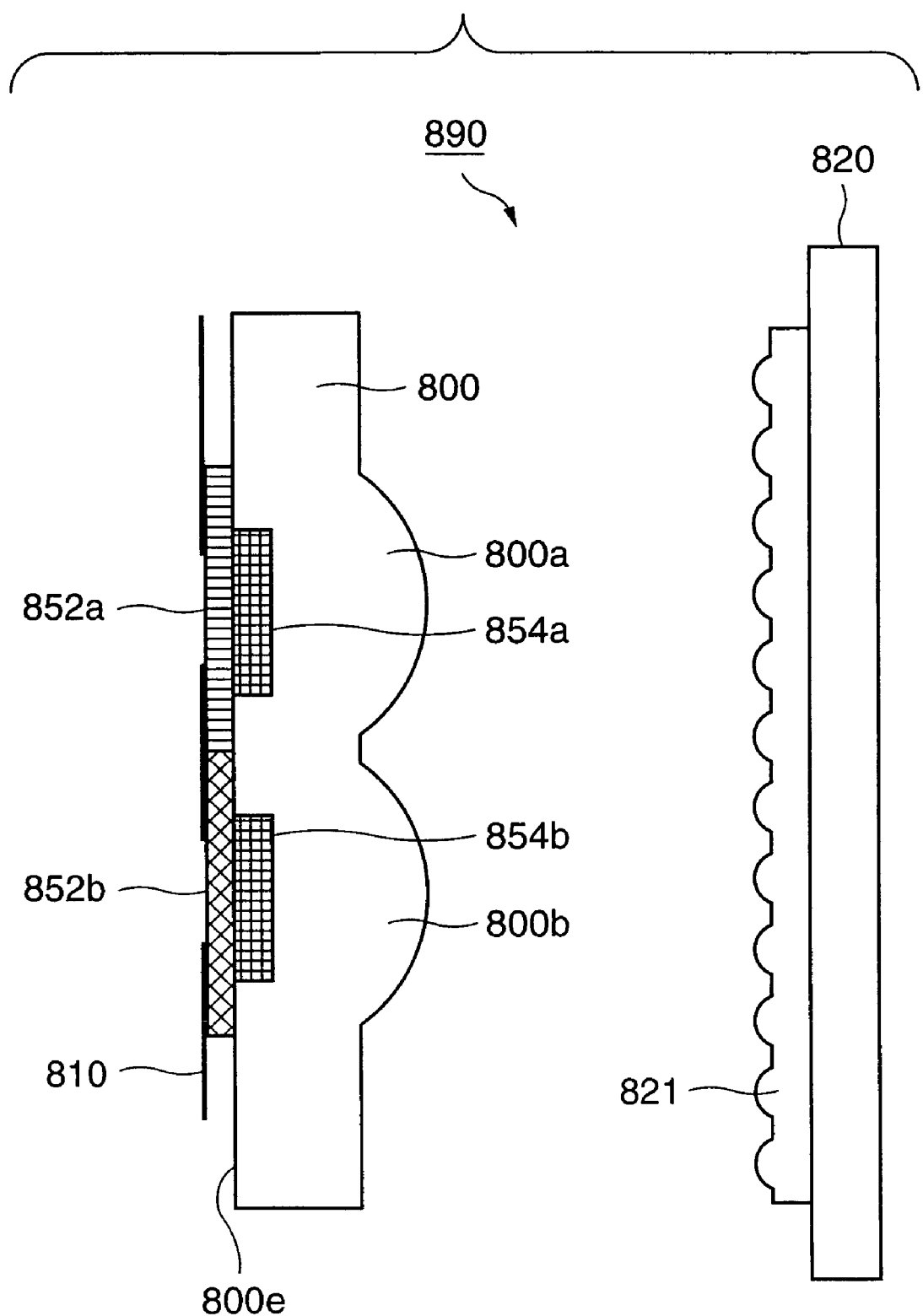
FIG. 5 is a detailed view of an image sensing system.

FIG. 5 is a detailed view of the image sensing system 890. Basic elements of a photographing optical system are the photographing lens 800, stop 810, and solid-state image sensing element 820. The image sensing system 890 comprises four optical systems for independently obtaining a green (G) image signal, red (R) image signal, and blue (B) image signal.

Since the assumed object distance is as very large as several m compared to the optical path length of an imaging system, if an incidence surface is aplanatic with respect to the assumed object distance, the incidence surface is a concave surface having a very small curvature, and is replaced by a plane in this embodiment.

Figure 7:
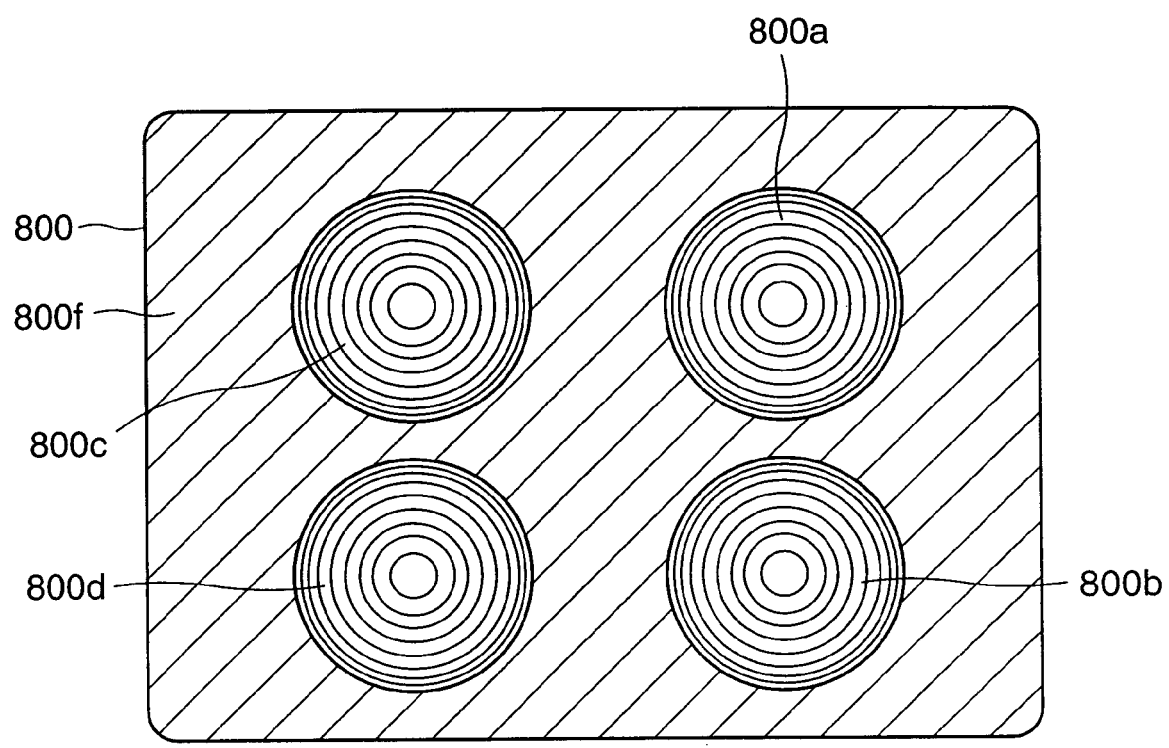
FIG. 7 shows a photographing lens viewed from the light exit side.

As shown in FIG. 7 viewed from the light exit side, the photographing lens 800 has four lens portions 800a, 800b, 800c, and 800d, each of which is formed by a zone spherical surface. Infrared ray cut filters having a low transmittance with respect to a wavelength range not less than 670 nm are formed on these lens portions 800a, 800b, 800c, and 800d, and a light-shielding film is formed on a flat portion 800f indicated by hatching.

The four lens portions 800a, 800b, 800c, and 800d respectively form imaging systems. As will be described later, the lens portions 800a and 800d are used to sense a green (G) image signal, the lens portion 800b is used to sense a red (R) image signal, and the lens portion 800c is used to sense a blue (B) image signal. All focal lengths at R, G, and B representative wavelengths are 1.45 mm.

In order to suppress high-frequency components of an object image equal to or higher than the Nyquist frequency determined by the pixel pitch of the solid-state image sensing element 820, and to improve response on the low-frequency side, a light incidence surface 800e of the photographing lens 800 has transmittance distribution regions 854a and 854b. This is called an apodization, which is a scheme for obtaining a desired MTF by providing characteristics that set a highest transmittance at the center of the stop, and lower the transmittance toward the outer periphery.

Figure 6:
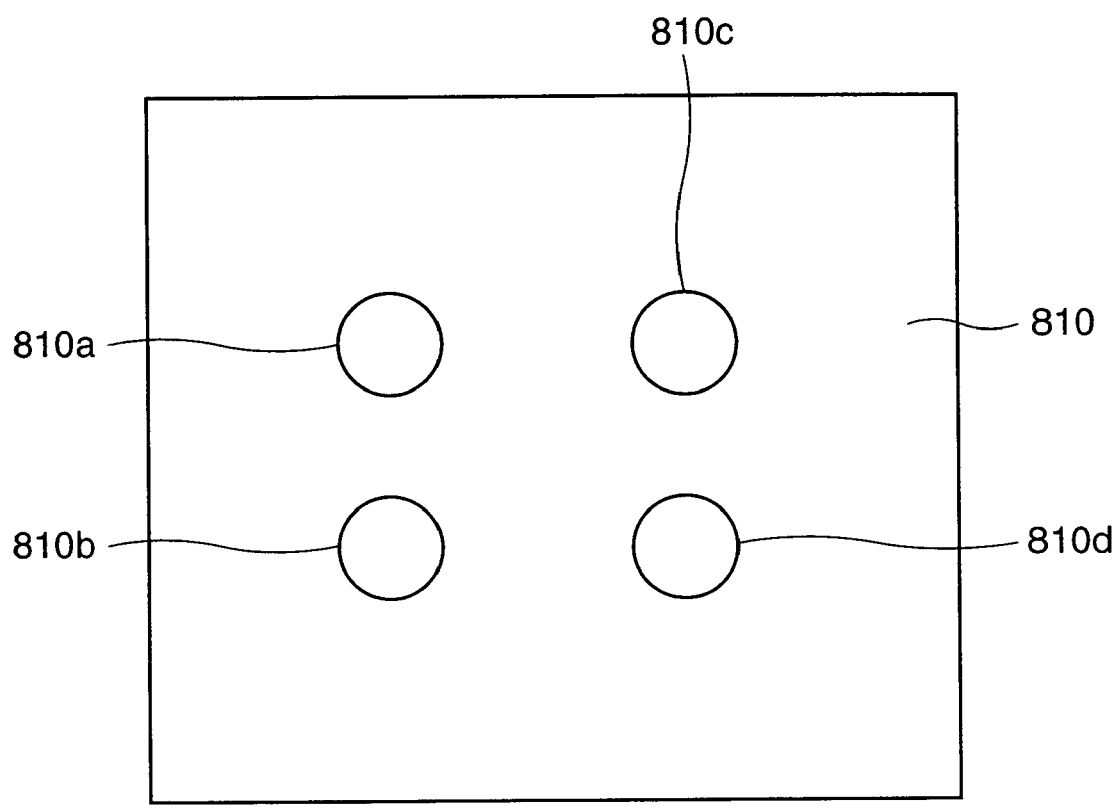
FIG. 6 is a plan view of a stop.

The stop 810 has four circular apertures 810a, 810b, 810c, and 810d, as shown in FIG. 6. Object light components which have entered the light incidence surface 800e via these apertures exit from the four lens portions 800a, 800b, 800c, and 800d, and form four objective images on the image sensing surface of the solid-state image sensing element 820. The stop 810, the light incidence surface 800e, and the image sensing surface of the solid-state image sensing element 820 are arranged parallel to each other. The stop 810 and four lens portions 800a, 800b, 800c, and 800d are set to have a positional relationship that satisfies the Twynken-Sommer condition, i.e., that which can simultaneously remove coma and astigmatism.

Figure 12:
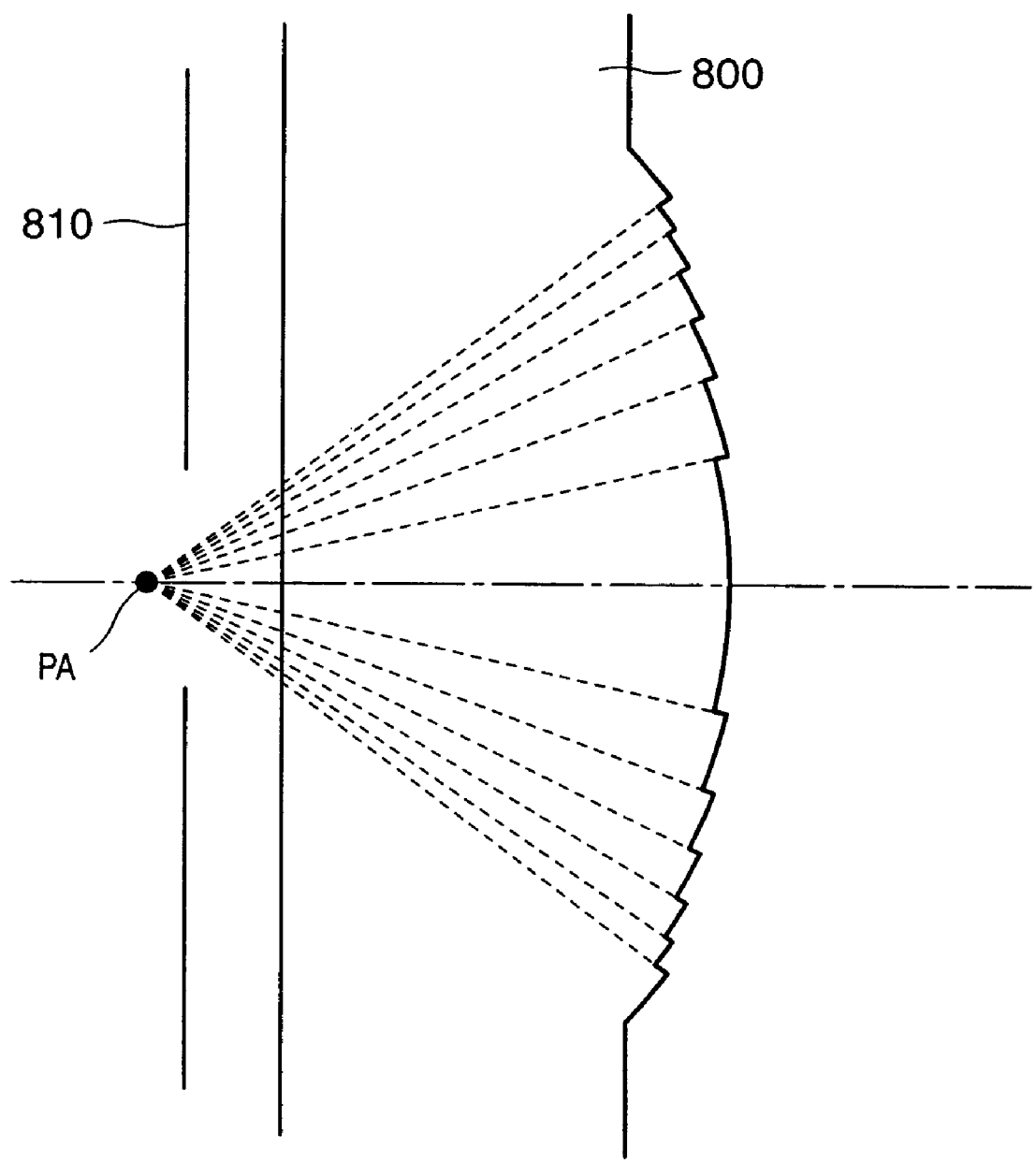
FIG. 12 is a sectional view of a lens portion.

By dividing the lens portions 800a, 800b, 800c, and 800d into zone patterns, the curvature of field can be satisfactorily corrected. An image surface formed by a single spherical surface is that expressed by the Petzval's curvature, but the image surface is planarized by joining a plurality of such spherical surfaces. As shown in FIG. 12 as a sectional view of the lens portion, all the spherical surfaces of the zones have an identical central position PA to satisfy a condition for removing coma and astigmatism, and when the lens portions 800a, 800b, 800c, and 800d are divided in such patterns, the curvatures of an object image produced by the respective zones become perfectly equal to each other, thus obtaining high overall MTF characteristics. The remaining curvatures in this case can be corrected by an arithmetic process. If the respective lens portions produce identical curvatures, a correction process can be simplified.

The radii of the zone spherical surfaces are set to increase like arithmetic series from the central zone toward the outer periphery, and the increment is given by $m\lambda/(n-1)$ (where $\lambda$ is the representative wavelength of an image formed by each lens portion, n is the refractive index of the photographing lens 800 with respect to this representative wavelength, and m is a positive constant). With this arrangement, the optical path length difference of light rays that pass neighboring zones is $m\lambda$, and exit light rays are in phase. When each lens portion is divided into a larger number of zones, it serves as a diffraction optical element.

In order to minimize flare produced at step portions of the zones, steps parallel to principal rays are formed, as shown in FIG. 12. Since the lens portions 800a, 800b, 800c, and 800d are away from a pupil, such arrangement can provide a great flare suppression effect.

Figure 8:
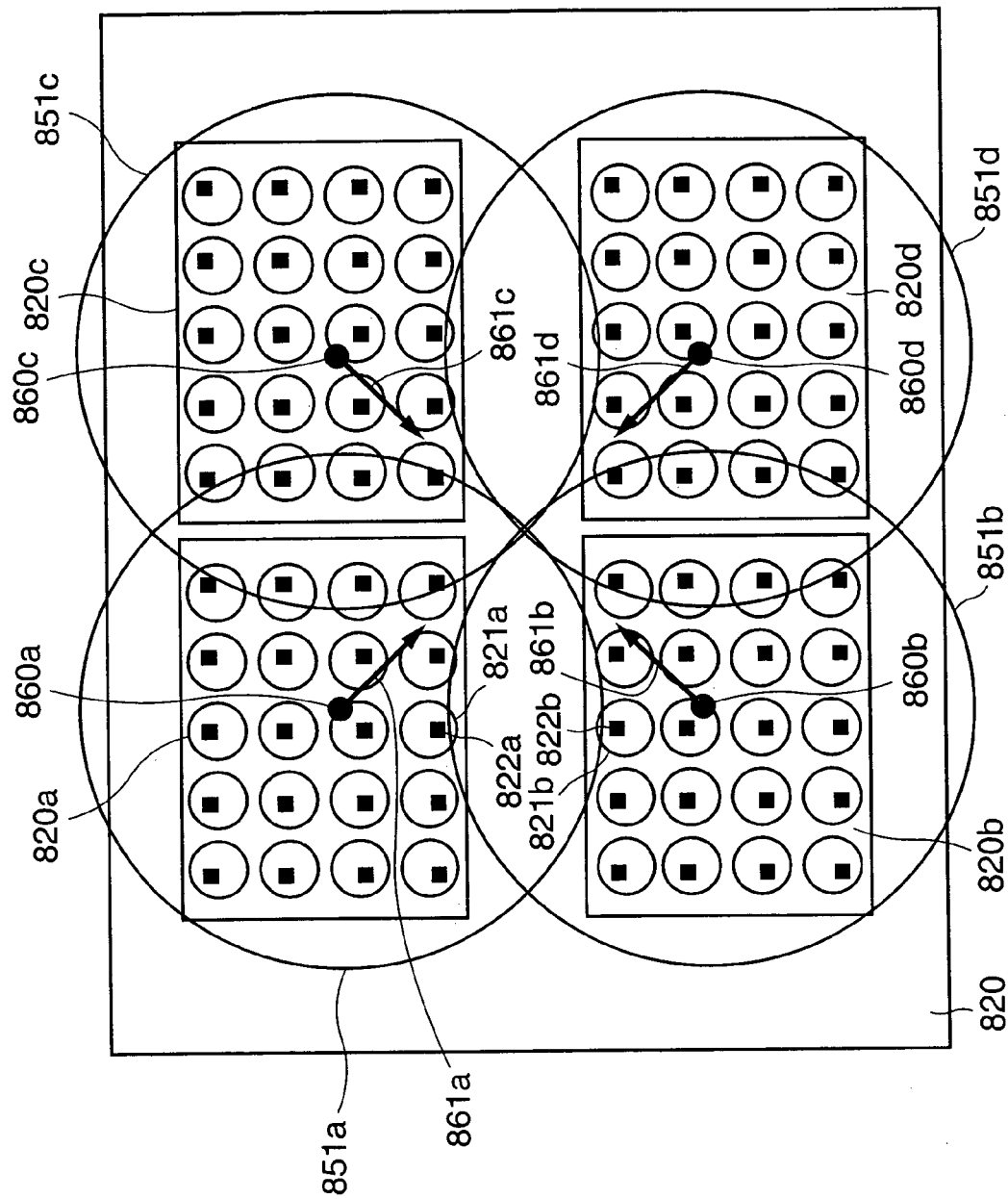
FIG. 8 is a front view of a solid-state image sensing element.

FIG. 8 is a front view of the solid-state image sensing element 820. The solid-state image sensing element 820 has four image sensing areas 820a, 820b, 820c, and 820d in correspondence with four object images to be formed. Although simply illustrated in FIG. 8, each of the image sensing areas 820a, 820b, 820c, and 820d is a 1,248 mm×0.936 mm area where 800×600 pixels are arranged to have vertical and horizontal pitches P of 1.56 μm, and the diagonal size of each image sensing area is 1.56 mm. A 0.156 mm (horizontal)×0.468 mm (vertical) separation band is formed between neighboring image sensing areas. Therefore, the distances between the centers of the image sensing areas are the same in the horizontal and vertical directions, i.e., 1.404 mm.

That is, if the image sensing areas 820a and 820d have horizontal pitch a=P, vertical pitch b=P, constant c=900, and positive integer h=1 on the light-receiving surface, these areas have a positional relationship in which they are separated a×h×c in the horizontal direction and b×c in the vertical direction within the light-receiving surface. By forming such relationship, misregistration caused by a change in temperature and a change in object distance can be corrected by a very simple arithmetic operation. Note that misregistration is mismatch of object image sampling positions caused among image sensing systems (e.g., R image sensing system/G image sensing system/B image sensing system) having different light-receiving spectrum distributions in, e.g., a multi-sensor color camera or the like.

Reference numerals 851a, 851b, 851c, and 851d in FIG. 8 denote image circles within which object images are formed. The maximum shape of each of the image circles 851a, 851b, 851c, and 851d is a circular shape determined by the sizes of the aperture of the stop and the exit-side spherical surface portion of the photographing lens 800 although their outer peripheral portions suffer illuminance drop due to the effect of the printed regions 162a and 162b formed on the protection glass 160 and sensor cover glass 162. Therefore, the image circles 851a, 851b, 851c, and 851d have overlapping portions.

Figure 9:
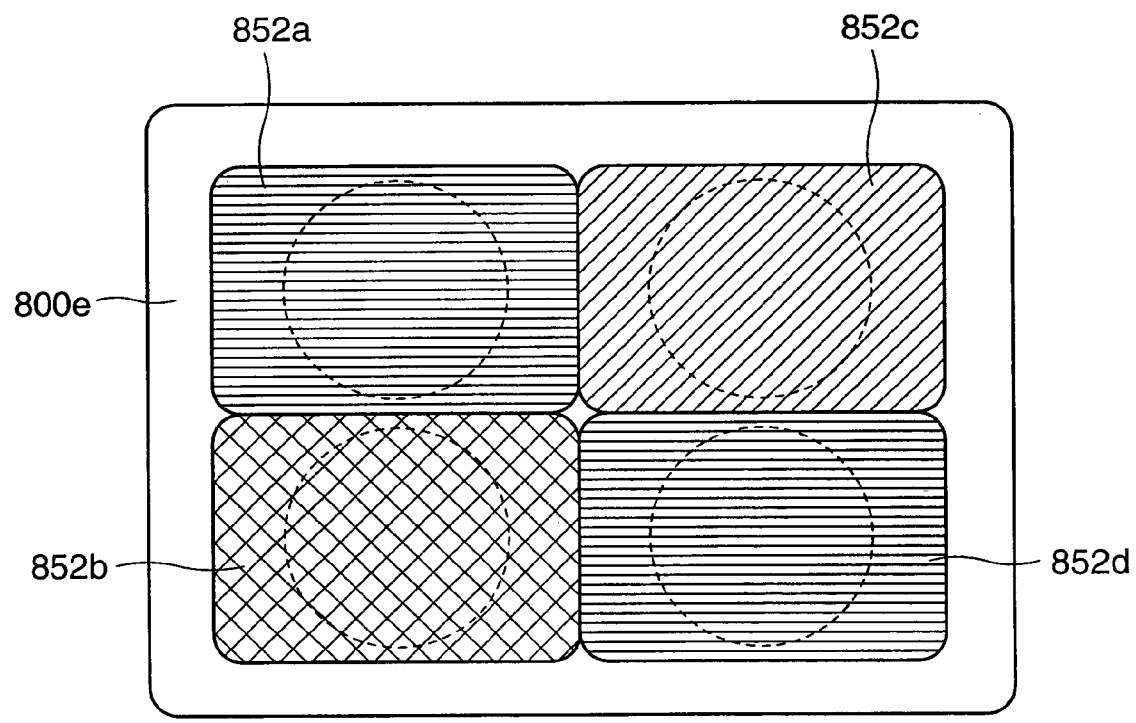
FIG. 9 shows the photographing lens viewed from the light incidence side.

Referring back to FIG. 5, hatched and cross-hatched portions 852a and 852b in a region sandwiched between the stop 810 and photographing lens 800 are optical filters, which are formed on the light incidence surface 800e of the photographing lens 800. As shown in FIG. 9 that shows the photographing lens 800 viewed from the light incidence side, the optical filters 852a, 852b, 852c, and 852d are formed on ranges that completely include the stop apertures 810a, 810b, 810c, and 810d.

Figure 10:
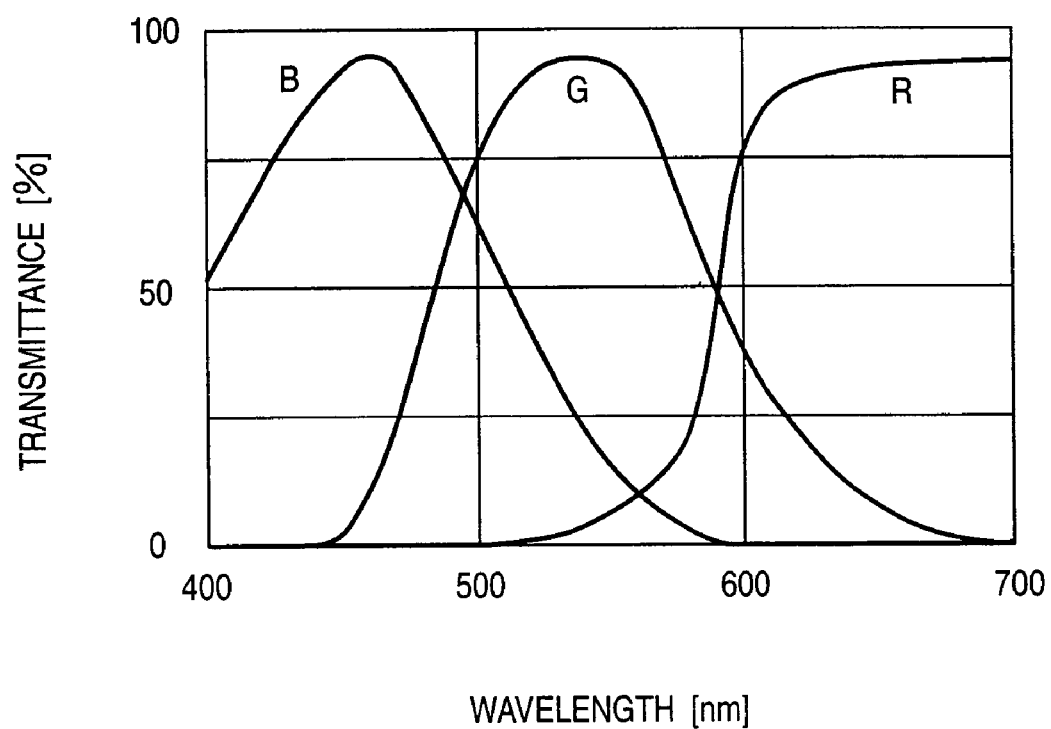
FIG. 10 is a graph showing the spectral transmission characteristics of an optical filter.

The optical filters 852a and 852d have spectral transmission characteristics that mainly transmit green, as indicated by G in FIG. 10. The optical filter 852b has spectral transmission characteristics that mainly transmit red, as indicated by R. Furthermore, the optical filter 852c has spectral transmission characteristics that mainly transmit blue, as indicated by B. That is, these filters are primary color filters. As the products with the characteristics of the infrared ray cut filters formed on the lens portions 800a, 800b, 800c, and 800d, object images are formed on the image circles 851a and 851d, 851b, and 851c by green, red, and blue light components, respectively.

When nearly equal focal lengths for the representative wavelengths of the spectrum distributions are set in the respective imaging systems, a color image that has satisfactorily undergone chromatic aberration correction can be obtained by compositing these image signals. Normally, an achromatic process for removing chromatic aberration requires a combination of at least two lenses having different dispersions. By contrast, since each imaging system has one lens, a cost reduction effect is expected. Furthermore, a low-profile image sensing system can be easily realized.

On the other hand, optical filters are formed on the four image sensing areas 820a, 820b, 820c, and 820d of the solid-state image sensing element 820. The spectral transmission characteristics of the image sensing areas 820a and 820d, 820b, and 820c are respectively those indicated by G, R, and B in FIG. 10. That is, the image sensing areas 820a and 820d, 820b, and 820c respectively have sensitivities to green (G), red (R), and blue (B) light components.

Since the light-receiving spectrum distribution of each image sensing area is given by the product of spectral transmittances of the pupil and image sensing area, even when image circles overlap each other, a combination of the pupil and image sensing area of the imaging system is nearly selected by the wavelength range.

Furthermore, microlenses 821 are formed on the image sensing areas 820a, 820b, 820c, and 820d for respective light-receiving portions (e.g., 822a, 822b) of pixels. Each microlens 821 is decentered with respect to the corresponding light-receiving portion of the solid-state image sensing element 820, and the decentering amount is set at zero at the center of each of the image sensing areas 820a, 820b, 820c, and 820d and becomes larger toward the outer peripheral portion. The decentering direction is a direction of a line segment that connects the center of each of the image sensing areas 820a, 820b, 820c, and 820d and each light-receiving portion.

Figure 11:
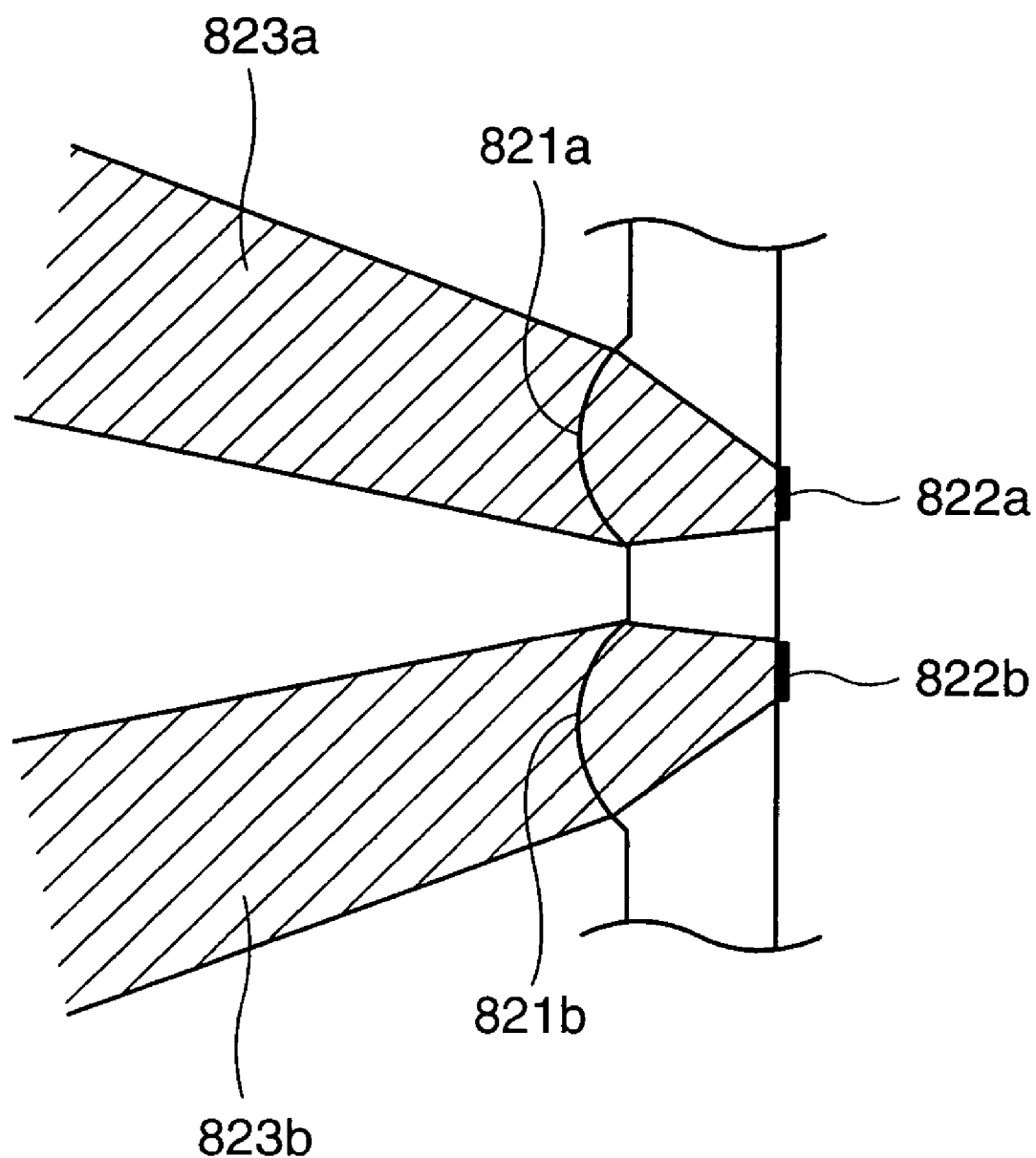
FIG. 11 is a view for explaining the function of microlenses.

FIG. 11 is a view for explaining the effect of the microlenses, and is an enlarged sectional view of neighboring light-receiving portions 822a and 822b of the image sensing areas 820a and 820b. A microlens 821a is decentered upward in FIG. 11 with respect to the light-receiving portion 822a, while the microlens 821b is decentered downward in FIG. 11 with respect to the light-receiving portion 822b. As a result, a light beam that enters the light-receiving portion 822a is limited to a hatched region 823a, and a light beam that enters the light-receiving portion 822b is limited to a hatched region 823b.

The light beam regions 823a and 823b have tilts in opposite directions, and are directed toward the lens portions 800a and 800b. Therefore, by appropriately selecting the decentering amounts of the microlenses, only light beams that have left specific pupils enter the respective image sensing areas. That is, the decentering amounts can be set so that object light components that respectively have passed through the apertures 810a, 810b, 810c, and 810d of the stop are photoelectrically converted mainly by the image sensing areas 820a, 820b, 820c, and 820d, respectively.

In addition to the aforementioned scheme for selectively assigning the pupils to the respective image sensing areas using the wavelength ranges, a scheme for selectively assigning the pupils to the respective image sensing areas using the microlenses is applied, and the printed regions are formed on the protection glass 160 and sensor cover glass 162. In this way, crosstalk among the wavelengths can be reliably prevented while allowing overlaps of the image circles. That is, object light components that respectively have passed through the apertures 810a, 810b, 810c, and 810d of the stop are photoelectrically converted by the image sensing areas 820a, 820b, 820c, and 820d, respectively. Therefore, the image sensing areas 820a and 820d, 820b, and 820c respectively output G, R, and B signals.

An image processing system (not shown) forms a color image on the basis of the selective photoelectric conversion outputs that the plurality of image sensing areas of the solid-state image sensing element 820 obtain from one of a plurality of object images. In this case, a signal process for correcting distortions of the imaging systems by arithmetic operations, and forming a color image with reference to a G image signal that contains the peak wavelength of 555 nm of the spectral luminous efficiency is executed. Since a G object image is formed on the two image sensing areas 820a and 820b, the number of pixels of the G object image is twice that of an R or B image signal, and an image which has high resolution especially in the wavelength range with high visual sensitivity can be obtained. In this case, a so-called pixel shift scheme for increasing the resolution by a fewer number of pixels by shifting object images on the image sensing areas 820a and 820d of the solid-state image sensing element ½ pixels in the vertical and horizontal directions is used. As shown in FIG. 8, object image centers 860a, 860b, 860c, and 860d which are also the centers of the image circles are respectively offset ¼ pixels from the centers of the image sensing areas 820a, 820b, 820c, and 820d in the directions of arrows 861a, 861b, 861c, and 861d, thus implementing a ½ pixel shift as a whole. Note that the lengths of the arrows 861a, 861b, 861c, and 861d do not represent the offset amount in FIG. 8.

Compared to an imaging system using a single photographing lens, if the pixel pitch of the solid-state image sensing element is fixed, the size of the object image of the scheme of this embodiment becomes $1/\sqrt{4}$ that of a Bayer matrix scheme in which R, G, and B color filters are formed on a solid-state image sensing element for respective sets of 2×2 pixels. Accordingly, the focal length of the photographing lens is shortened approximately to $1/\sqrt{4}=\frac{1}{2}$. Therefore, the present invention is very effective to realize a low-profile camera.

The positional relationship between the photographing lens and image sensing areas will be explained below. As described above, each image sensing area has a size of 1.248 mm×0.936 mm, and these image sensing areas neighbor in the horizontal direction via a 0.156 mm (horizontal)×0.468 mm (vertical) separation band. The spacing between the centers of the neighboring image sensing areas is 1.404 mm in the vertical and horizontal directions, and is 1.9856 mm in the diagonal direction.

Figure 13:
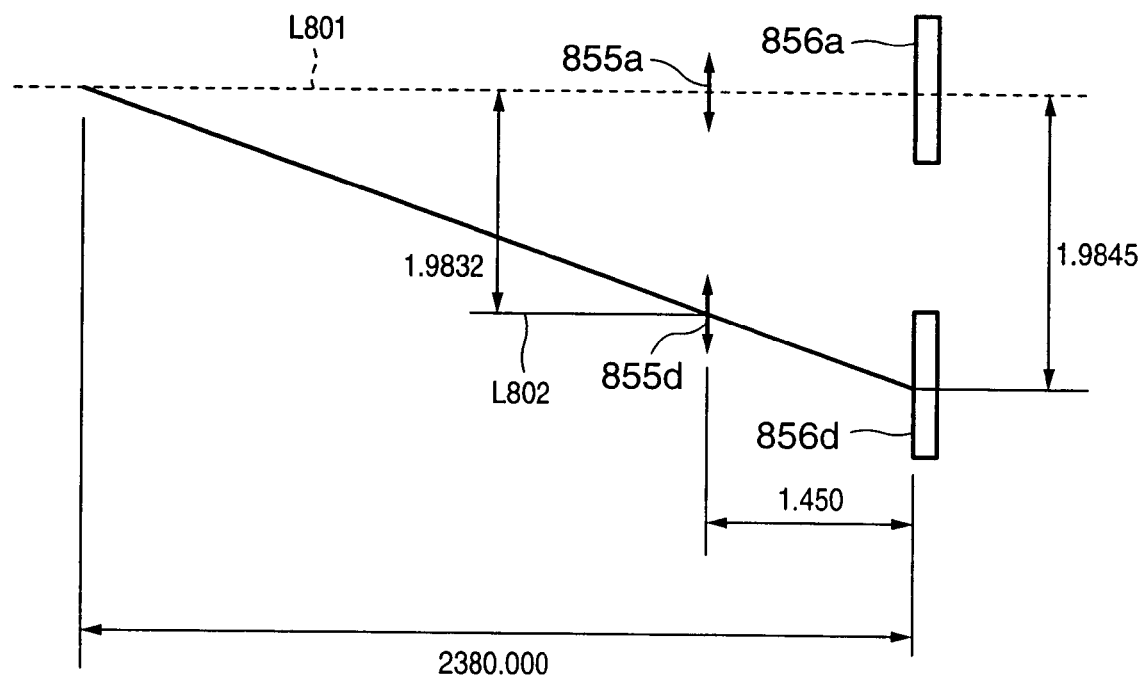
FIG. 13 is a view for explaining the spacing setup process of lens portions of the photographing lens.

Paying attention to the image sensing areas 820a and 820d, assume that an image of an object located at a position of a reference object distance of 2.38 m is formed on the image sensing portion at intervals of 1.9845 mm obtained by subtracting the diagonal size for a 0.5 pixel from 1.9856 mm as the image sensing area spacing so as to implement a pixel shift. As a result, the spacing between the lens portions 800a and 800d of the photographing lens 800 is set at 1.9832 mm, as shown in FIG. 13. In FIG. 13, arrows 855a and 855d are symbols that represent imaging systems having a positive power by the lens portions 800a and 800d of the photographing lens 800, rectangles 856a and 856d are symbols that represent the ranges of the image sensing areas 820a and 820d, and L801 and L802 indicate the optical axes of the imaging systems 855a and 855d. Since the light incidence surface 800e of the photographing lens 800 is a plane, and the lens portions 800a and 800d as light exit surfaces are Fresnel lenses defined by concentric spherical surfaces, a straight line which is perpendicular to the light incidence surface via the center of a sphere is an optical axis.

Figure 14:
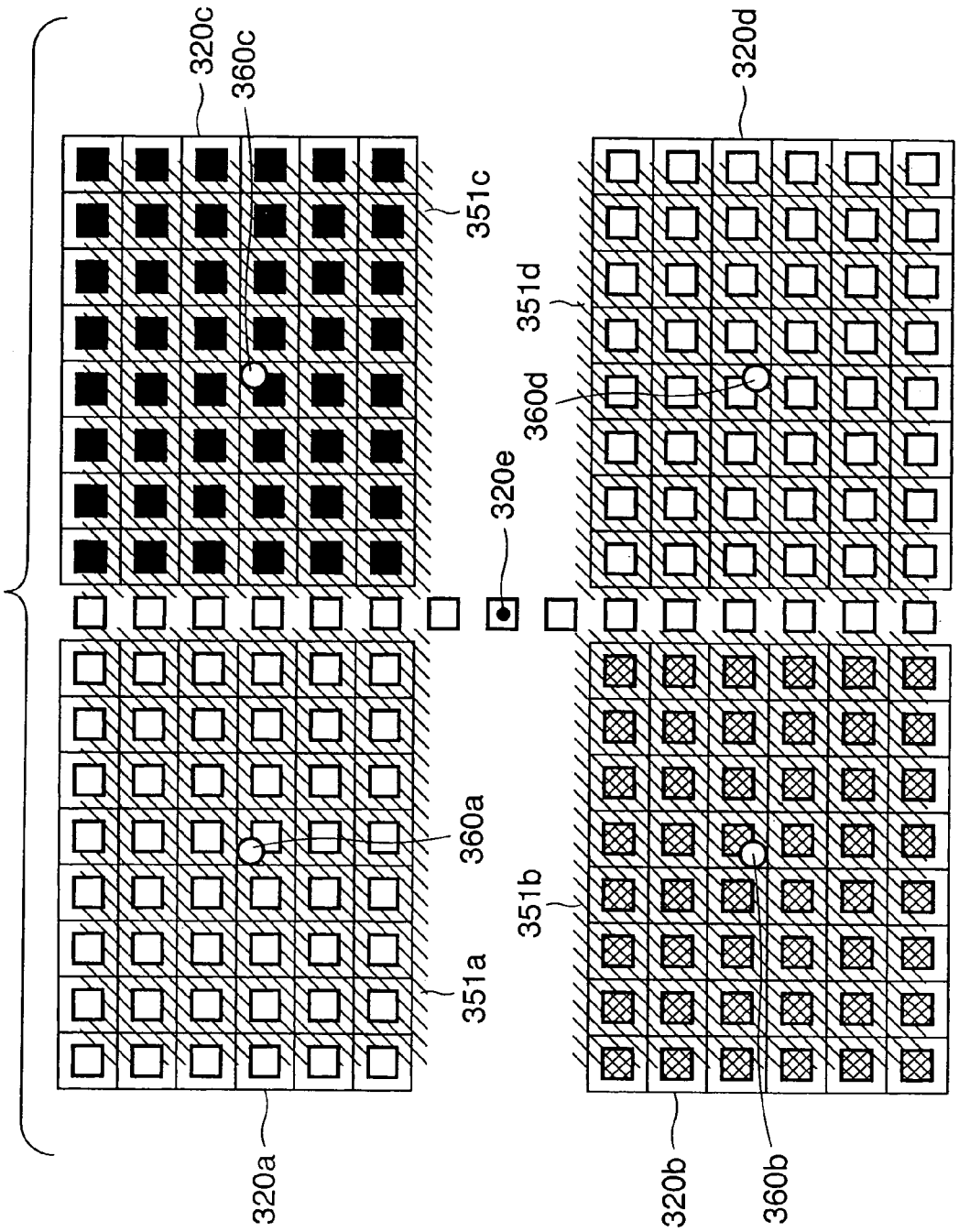
FIG. 14 is a view for explaining the positional relationship between an object image and image sensing areas.
Figure 15:
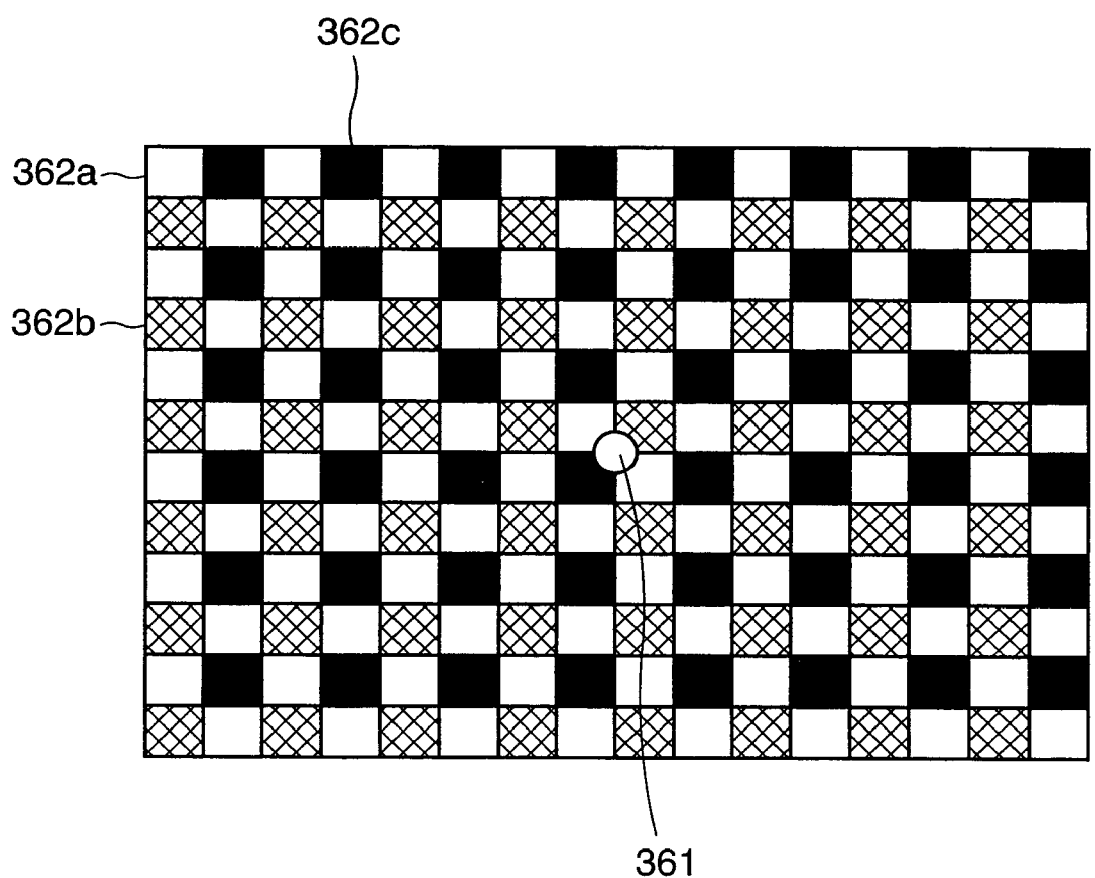
FIG. 15 is a view for explaining the positional relationship of pixels upon projecting the image sensing areas onto an object.

The positional relationship between the object images and image sensing areas, and that of pixels upon projection onto an object will be explained below while reducing the numbers of pixels in the vertical and horizontal directions to $\frac{1}{100}$ for the sake of simplicity. FIGS. 14 and 15 are explanatory views of them.

Referring first to FIG. 14, reference numerals 320a, 320b, 320c, and 320d denote four image sensing areas of the solid-state image sensing element 820. For the sake of simplicity, each of the image sensing areas 320a, 320b, 320c, and 320d has an 8×6 pixel matrix. The image sensing areas 320a and 320d, 320b, and 320c respectively output G, R, and B image signals. Pixels in the image sensing areas 320a and 320d are indicated by open rectangles, those in the image sensing area 320b are indicated by hatched rectangles, and those in the image sensing area 320c are indicated by closed rectangles.

A separation band having a size of one pixel (horizontal)×3 pixels (vertical) is formed between neighboring image sensing areas. Therefore, the distances between the centers of the image sensing areas for outputting G images are equal to each other in the horizontal and vertical directions.

Reference numerals 351a, 351b, 351c, and 351d denote object images. To attain a pixel shift, centers 360a, 360b, 360c, and 360d of the object images 351a, 351b, 351c, and 351d are offset ¼ pixels from the centers of the image sensing areas 320a, 320b, 320c, and 320d in the direction of a center 320e of the entire image sensing area.

As a result, the image sensing areas are projected backward onto a plane at a predetermined distance on the object field side, as shown in FIG. 15. On the object field side as well, a backward projected image of the pixels in the image sensing areas 320a and 320d is indicated by open rectangles 362a, that in the image sensing area 320b is indicated by hatched rectangles 362b, and that in the image sensing area 320c is indicated by closed rectangles 362c.

The backward projected images of the centers 360a, 360b, 360c, and 360d of the object images overlap each other as a point 361, and the respective pixels in the image sensing areas 320a, 320b, 320c, and 320d are projected backward so that their centers do not overlap each other. Since the open, hatched, and closed rectangles respectively output G, R, and B image signals, sampling equivalent to an image sensing element having color filters in a Bayer matrix can be done on an object.

A viewfinder system will be explained below. The low-profile structure of this viewfinder device is realized using the nature that light is totally reflected by an interface between a medium with a high refractive index and that with a low refractive index. The arrangement used in the air will be explained.

FIG. 16 is a perspective view of the first and second prisms 112 and 113 which form the viewfinder. The first prism 112 has four surfaces 112c, 112d, 112e, and 112f at a position facing a surface 112a (see FIG. 17), and object light that has entered the prism from the surface 112a leaves the prism from the surfaces 112c, 112d, 112e, and 112f. The surfaces 112a, 112c, 112d, 112e, and 112f are planes.

On the other hand, the second prism 113 has surfaces 113c, 113d, 113e, and 113f at positions facing the surfaces 112c, 112d, 112e, and 112f of the first prism 112. Object light that has entered the prism from the surfaces 113c, 113d, 113e, and 113f leaves the prism from the surface 113a. The surfaces 112c, 112d, 112e, and 112f of the first prism 112 oppose the surfaces 113c, 113d, 113e, and 113f of the second prism 113 via a small air gap. Therefore, the surfaces 113c, 113d, 113e, and 113f of the second prism 113 are also planes.

In order to allow the user to observe an object while he or she brings an eye close to the viewfinder, the viewfinder system has no refracting power. Therefore, since the object light incidence surface 112a of the first prism 112 is a plane, the object light incidence surface 113a of the second prism 113 is also a plane. In addition, these surfaces are parallel to each other. Furthermore, since the image sensing system 890 and a signal processing system obtain a rectangular image as a total process including arithmetic distortion correction, an observation field that can be observed via the viewfinder must have a rectangular shape. Therefore, all the optically effective surfaces of the first and second prisms 112 and 113 are symmetrical to each other in the vertical and horizontal directions. A line of intersection between two symmetric surfaces is a viewfinder optical axis L1.

Figure 17:
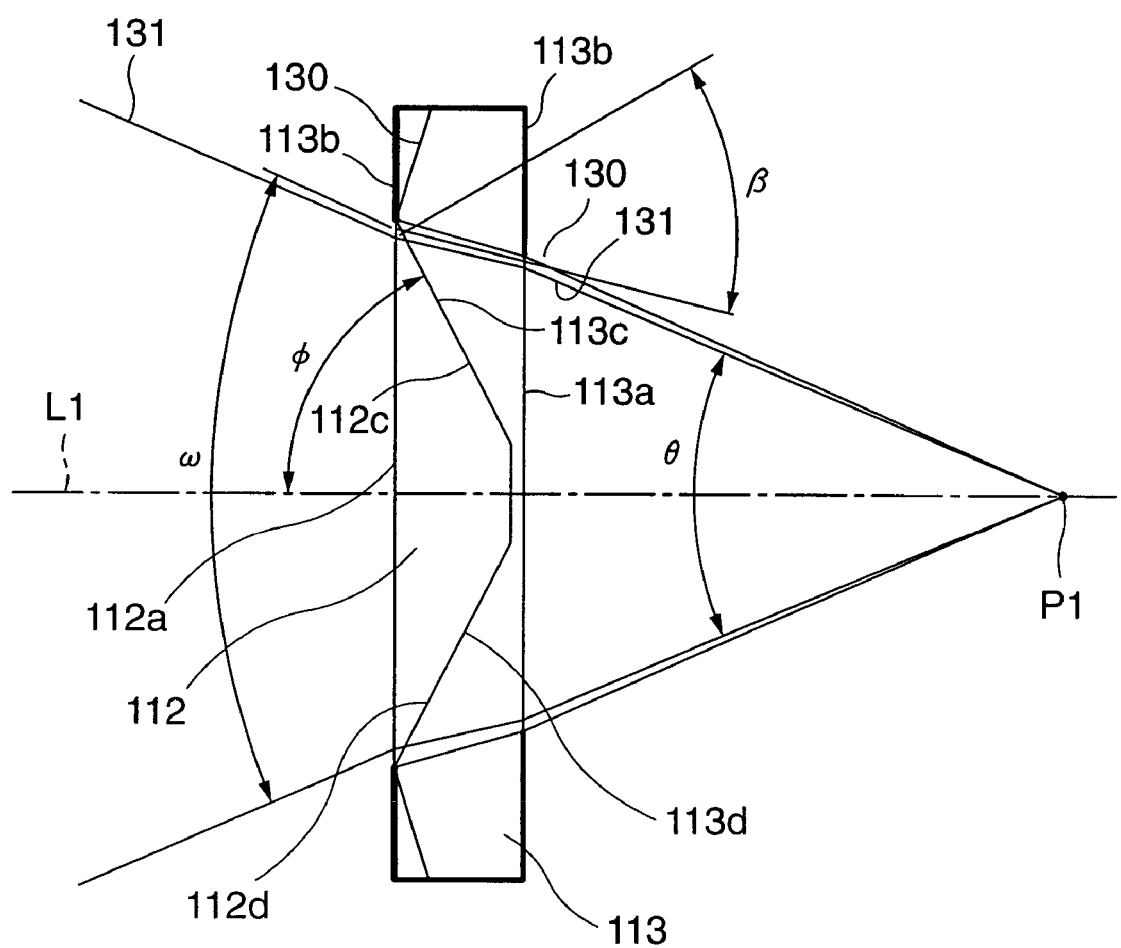
FIG. 17 is a sectional view of a viewfinder system.

FIG. 17 is a view for explaining the role of the surfaces which oppose each other via an air gap. FIG. 17 is a top view of a state wherein the viewfinder system is formed by combining the first and second prisms 112 and 113 to have a predetermined positional relationship, and an optical path from the eye position of the observer is traced backward in the principal section.

Referring to FIG. 17, a point P1 is a point farthest from the viewfinder, where the entire observation field can be overlooked when the pupil of the eye of the observer is stopped down to infinity, i.e., a so-called an eye point.

A light ray 130 which comes from the point P1 and has an angle slightly exceeding a viewfinder field angle ω will be examined. The light ray 130 is refracted by the surface 130a of the second prism 113, and reaches the surface 113c. The inclination angle of the surface 113c is set so that an incident angle β of a light ray corresponding to the viewfinder field angle ω becomes a critical angle. Therefore, the incident angle of the light ray 130 on the incidence surface 113c slightly exceeds the critical angle. As a result, the light ray 130 cannot emerge from the surface 113c, and is totally reflected. The light-shielding printed region 113b is formed on each side surface of the second prism 113, and the light ray 130 is absorbed there. Therefore, the observer cannot observe an object in a direction of the light ray 130, and recognizes only a dark portion indicating a range outside the object field.

A light ray 131 which comes from the point P1 and has an angle slightly smaller than the viewfinder field angle ω will be examined. The light ray 131 is refracted by the surface 113a of the second prism 113 and reaches the surface 113c. As described above, the inclination angle of the surface 113c is set so that the incident angle β of a light ray corresponding to the viewfinder field angle ω becomes a critical angle. The incident angle of the light ray 131 on the surface 113c is slightly smaller than the critical angle. The light ray 131 emerges from the surface 113c, passes through a small air gap, and then enters the surface 112c of the first prism 112. Since the surface 113c and the surface 112c opposite to it have the same shape, the direction in which the light ray travels in the first prism 112 is the same as that in the second prism 113.

For the light ray that has reached the first prism 112, the total characteristics of the first and second prisms 112 and 113 are equivalent to a plane-parallel plate. As a result, the light ray 131 emerges from the surface 112a with an angle equal to its incident angle to the surface 113a. That is, the field angle β is equal to the viewfinder field angle ω. Therefore, the observer can observe an object in the direction of the light ray 131, and can recognize an object field. The optical paths of the light rays 130 and 131 reveal that the viewfinder field can be limited by exploiting the critical angle, i.e., a clear boundary of the viewfinder field can be obtained.

Since the first and second prisms 112 and 113 have symmetrical shapes, as described above, optical paths symmetrical to those shown in FIG. 17 about the viewfinder optical axis L1 are present. Furthermore, the limitation of the viewfinder field is similarly imposed on the relationships between the surfaces 112e and 112f of the first prism 112, and the surfaces 113e and 113f of the second prism 113. In the above examination, the light rays are traced backward from the eye position of the observer for the sake of simplicity. Upon examining the optical path in a direction in which light coming from an object travels, since light rays have reversibility, the above examinations are equivalent to that object light that has entered the object light incidence surface 112a of the first prism 112 from a range within the observation field passes through the air gap, and object light that has entered the object light incidence surface 112a of the first prism 112 from a range outside the observation field does not pass through the air gap. Therefore, as the total viewfinder characteristics, a roughly rectangular viewfinder field can be obtained from the position of the point P1.

A schematic arrangement of the signal processing system will be explained below.

Figure 18:
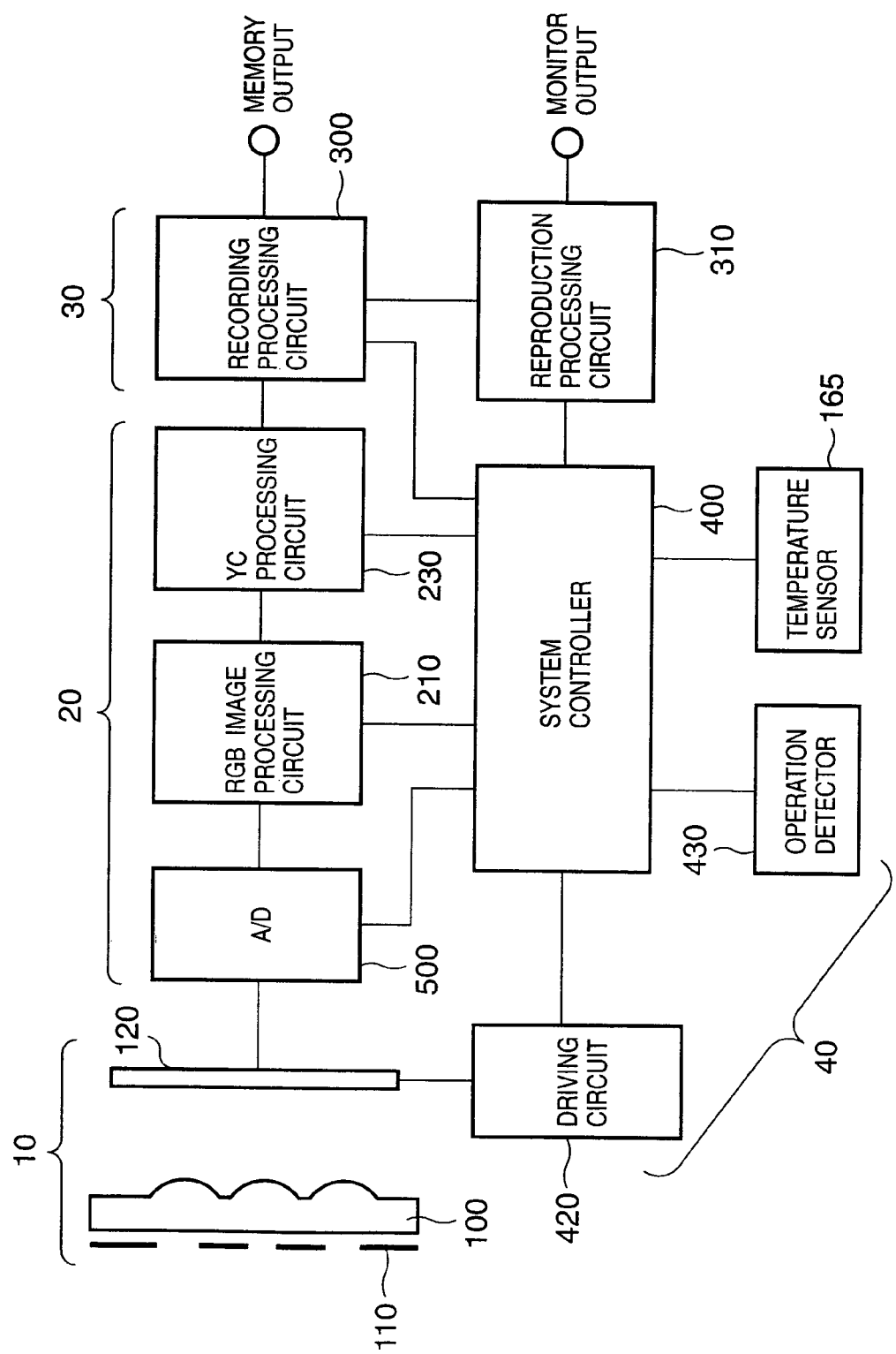
FIG. 18 is a block diagram of a signal processing system.

FIG. 18 is a block diagram of the signal processing system. This camera is a single-sensor digital color camera which uses a solid-state image sensing element 120 such as a CCD, CMOS sensor, or the like, and obtains an image signal that represents a moving image or still image by driving the solid-state image sensing element 120 continuously or in a one-shot manner. Note that the solid-state image sensing element 120 is an image sensing device of a type which converts exposed light into an electrical signal for respective pixels, accumulates a charge corresponding to the light amounts, and reads out the charge.

Note that FIG. 18 illustrates only blocks which are directly related to the present invention, and an illustration and description of those which are not directly related to the present invention will be omitted.

As shown in FIG. 18, the image sensing apparatus has an image sensing system 10, an image processing system 20 as an image processing means, a recording/reproduction system 30, and a control system 40. Furthermore, the image sensing system 10 includes a photographing lens 100, a stop 110, and the solid-state image sensing element 120. The image processing system 20 includes an A/D converter 500, RGB image processing circuit 210, and YC processing circuit 230. The recording/reproduction system 30 includes a recording processing circuit 300 and reproduction processing circuit 310. The control system 40 includes a system controller 400, operation detector or detection circuit 430, temperature sensor 165, and solid-state image sensing element driving circuit 420.

The image sensing system 10 is an optical processing system for forming an optical image coming from an object on the image sensing surface of the solid-state image sensing element 120 via the stop 110 and photographing lens 100, and exposes the solid-state image sensing element 120 to an object image. As described above, the solid-state image sensing element 120 effectively uses an image sensing device such as a CCD, CMOS sensor, or the like, and an image signal that represents a moving image sequence or an image signal that represents a still image by one-shot exposure can be obtained by controlling the exposure time and interval of the solid-state image sensing element 120.

As described above, the solid-state image sensing element 120 is an image sensing device which has 800 pixels in the longitudinal direction×600 pixels in the widthwise direction of each image sensing area, i.e., a total of 1.92 million pixels. Optical filters of three primary colors, i.e., red (R), green (G), and blue (B) are arranged on the front surface of the image sensing element 120 for respective areas.

Image signals read out from the solid-state image sensing element 120 are supplied to the image processing system 20 via the A/D converter 500. The A/D converter 500 is a signal conversion circuit for converting an input signal into, e.g., a 10-bit digital signal in accordance with the amplitude of a signal of each exposed pixel, and outputting the digital signal, and the subsequent image signal processes are implemented by digital processes.

The image processing system 20 is a signal processing circuit for obtaining an image signal of a desired format from R, G, and B digital signals, and converts R, G, and B color signals into YC signals including a luminance signal Y and color difference signals (R-Y) and (B-Y), or the like.

The RGB image processing circuit 210 is a signal processing circuit for processing image signals of 800×600×4 pixels received from the solid-state image sensing element 120 via the A/D converter 500, and has a white balance circuit, gamma correction circuit, and interpolation arithmetic circuit for achieving high resolution by interpolation.

The YC processing circuit 230 is a signal processing circuit for generating a luminance signal Y and color difference signals R-Y and B-Y. The circuit 230 comprises a high-frequency luminance generation circuit for generating a high-frequency luminance signal YH, a low-frequency luminance signal generation circuit for generating a low-frequency luminance signal YL, and a color difference signal generation circuit for generating color difference signals R-Y and B-Y. The luminance signal Y is formed by mixing the high- and low-frequency luminance signals YH and YL.

The recording/reproduction system 30 is a processing system for outputting an image signal to a memory, and outputting an image signal to a liquid crystal monitor 4. The system 30 includes the recording processing circuit 300 for executing read/write processes of an image signal from/to a memory, and the reproduction processing circuit 310 for reproducing an image signal read out from the memory, and outputting the reproduced signal to the monitor. More specifically, the recording processing circuit 300 includes a compression/expansion circuit for compressing YC signals, which represent a still image and moving image, in a predetermined compression format, and expanding compressed data when it is read out.

The compression/expansion circuit has a frame memory and the like for signal processes, stores YC signals from the image processing system 20 in this frame memory for respective frames, reads out the stored signals for a plurality of blocks, and encodes them by compression coding. Compression coding is implemented by performing two-dimensional orthogonal transformation, normalization, and Huffman coding of image signals for respective blocks.

The reproduction processing circuit 310 is a circuit for converting the luminance signal Y and color difference signals R-Y and B-Y using a matrix into, e.g., R, G, and B signals. The signals converted by the reproduction processing circuit 310 are output to the liquid crystal monitor 4, thus displaying and reproducing a visible image.

The control system 40 includes control circuits of respective units for controlling the image sensing system 10, image processing system 20, and recording/reproduction system 30 in response to an external operation, and controls driving of the solid-state image sensing element 120, the operation of the RGB image processing circuit 210, the compression process of the recording processing circuit 300, and the like upon detection of pressing of the release button 106. More specifically, the control system 40 includes the operation detector 430 for detecting the operation of the release button 106, the system controller 400 for controlling respective units in response to a detection signal from the detector, and generating and outputting timing signals and the like upon sensing an image, and the solid-state image sensing element driving circuit 420 for generating a driving signal used to drive the solid-state image sensing element 120 under the control of the system controller 400.

The RGB image processing circuit 210 executes the following processes. The white balance circuit in the RGB image processing circuit 210 executes predetermined white balance correction of R, G, and B signals output via the A/D converter 500 in correspondence with R, G, and B regions, and the gamma correction circuit executes predetermined gamma correction for these signals. The interpolation arithmetic circuit in the RGB image processing circuit 210 executes an interpolation process and distortion correction of image signals from the solid-state image sensing element 120 to generate R, G, and B image signals each having a resolution of 1200×1600, and supplies these signals to the subsequent high- and low-frequency luminance signal generation circuits and color difference signal generation circuit.

This interpolation process includes a first interpolation process for correcting misregistration resulting from relative shifts of object images caused by expansion/shrinkage of the photographing lens due to a change in temperature or from manufacturing errors of the photographing lens, and a second interpolation process for forming a composite image signal by setting R, G, and B image signals to have an identical resolution.

The subsequent distortion correction is an arithmetic process for correcting distortion of the photographing optical system by a known scheme. In this case, since R, G, and B object images have identical magnifications and distortions depending on setups of the photographing lens 100, they can undergo unique distortion correction. By correcting the distortion of the photographing optical system by arithmetic operations, the arrangement of the photographing lens 100 can be optimized to correct other optical aberrations.

Details of the first interpolation process are as follows.

Both the object image spacing and image sensing area spacing vary due to changes in the image sensing system 10 resulting from a change in temperature. Let $\alpha_S$ be the linear expansion coefficient of the solid-state image sensing element 120, $\alpha_L$ be that of the photographing lens 100, $\Delta T$ be the temperature change amount, and $d_O$ be the spacing between neighboring lens portions. Then, since the image sensing system 10 has a very small imaging magnification, a registration change amount $\Delta Z_T$ between the image sensing areas 820a and 820d can be expressed as the difference between expansions of the photographing lens and solid-state image sensing element by:

$$\Delta Z_T = d_O \times (\alpha_L - \alpha_S) \times \Delta T \tag{1}$$

If $\alpha_S = 0.26 \times 10^{-5}$, $\Delta T = 20°$, $d_O = 1.9832$ [m] as the spacing between the lens portions which form two G object images, and $\alpha_L = 1.2 \times 10^{-5}$ assuming that the photographing lens 100 is made up of low-melting point glass, we have $\Delta Z_T = 0.00037$ [m]. This value is the spacing change amount between the two G object images, and also that between R and B object images. The temperature change amount $\Delta T$ is obtained by the temperature sensor 165.

Figure 19:
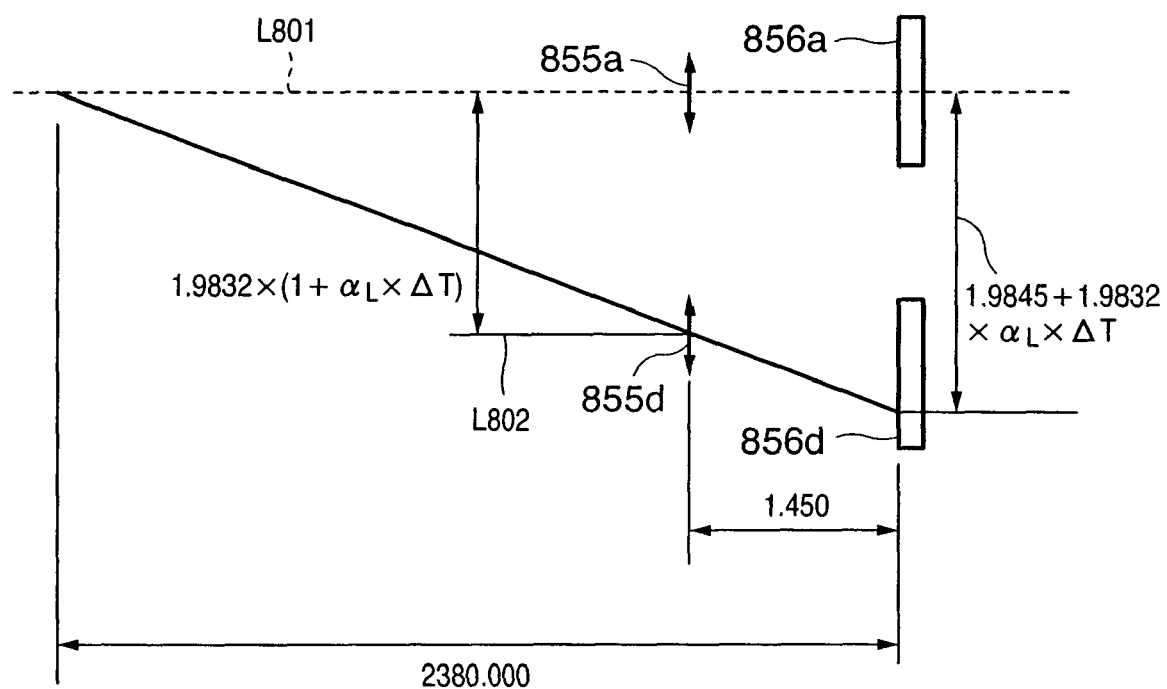
FIG. 19 is a view for explaining a state wherein the positions of elements of the image sensing system have changed due to thermal expansion.

FIG. 19 illustrates this state, i.e., a state in which the positions of the same elements as those illustrated in FIG. 13 have changed due to thermal expansion. FIG. 19 is depicted with reference to the imaging system 855a for the sake of simplicity. The imaging system 855a corresponds to the lens portion 800a in the photographing lens 800 shown in FIG. 7, and the imaging system 855d corresponds to the lens portion 800d.

Misregistration due to shifts of object images caused by expansion or shrinkage of the photographing lens is produced in a direction to connect the optical axes of the two imaging systems. Upon examining the imaging systems 855a and 855d, misregistration between these systems takes place in a direction parallel to the plane of paper of FIG. 19. The reason why this interpolation process is done before distortion correction is that the direction of misregistration has deviated from that parallel to the plane of paper after distortion correction, and interpolation cannot be implemented by simple arithmetic operations.

If a temperature difference $\Delta T$ [° C.] has occurred compared to that upon manufacture, the optical axis distance $d_O$ between the imaging systems 855a and 855d changes by $d_O \times \alpha_L \times \Delta T$. Since the image sensing system 10 has a very small imaging magnification, the shift amount of an object image on the image sensing area 856d can also be considered as $d_O \times \alpha_L \times \Delta T$. On the other hand, the solid-state image sensing element 120 also suffers slight thermal deformation. By utilizing the fact that the imaging magnification is very small, that change amount can be expressed by $d_O \times \alpha_S \times \Delta T$. Therefore, the registration change amount $\Delta Z_T$ is expressed by their difference, and is given by $d_O \times (\alpha_L - \alpha_S) \times \Delta T$, as described above.

If $$K_T = d_O \times (\alpha_L - \alpha_S) \tag{2}$$

the registration change amount $\Delta Z_T$ is given as the product of a constant and the temperature difference by:

$$\Delta Z_T = K_T \times \Delta T \tag{3}$$

where $K_T$ is the registration temperature coefficient of a G image. If one unit is expressed by one pixel pitch (px1), the registration change amount is given by $\Delta Z_T/P$ using the pixel pitch P.

Misregistration due to a change in temperature occurs among all the imaging systems.

On the other hand, since misregistration due to manufacturing errors of the photographing lens can be reduced to a relatively small value, only components in the same direction as misregistration due to expansion or shrinkage of the photographing lens will be considered for the sake of simplicity.

Misregistration due to manufacturing errors of the photographing lens are defined as follows with reference to the positional relationship between the image sensing area 820a and an object image formed in the image circle 851a:

- $\Delta r$ (px1): a manufacturing error of the positional relationship between the image sensing area 820b and an object image formed in the image circle 851b;
- $\Delta b$ (px1): a manufacturing error of the positional relationship between the image sensing area 820c and an object image formed in the image circle 851c;
- $\Delta g$ (px1): a manufacturing error of the positional relationship between the image sensing area 820d and an object image formed in the image circle 851d.

One pixel pitch (px1) is one unit.

Figure 20:
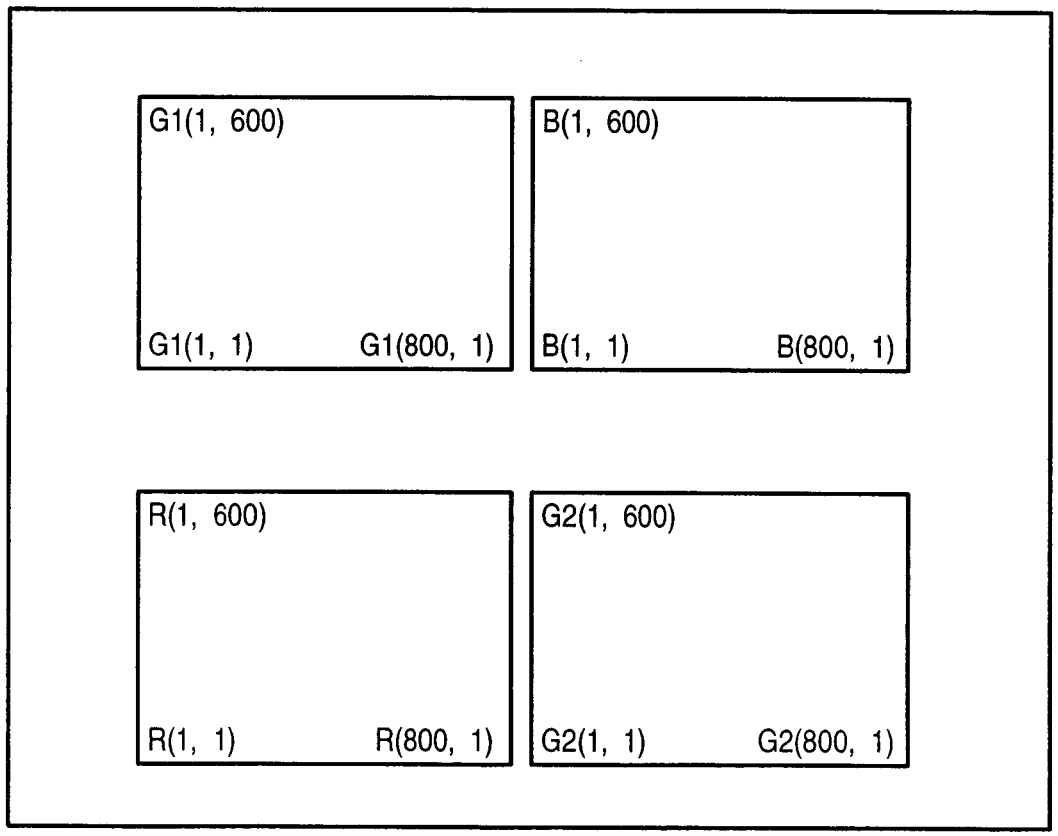
FIG. 20 is a view for explaining the addresses of image signals from the image sensing areas.

An actual first interpolation process for correcting misregistration due to a change in temperature and manufacturing errors mentioned above is done as follows. Let $G1(i,j)$, $R(i,j)$, $B(i,j)$, and $G2(i,j)$ be image signals from the image sensing areas 820a, 820b, 820c, and 820d, and addresses are defined, as shown in FIG. 20.

Interpolated image signals $G2_T(i,j)$, $R_T(i,j)$, and $B_T(i,j)$ of $G2(i,j)$, $R(i,j)$, and $B(i,j)$ are generated with reference to the image signal $G1(i,j)$ of the imaging system 855a (lens portion 800a) on the basis of equations (4) to (9) below. Equations (4) to (9) are used to generate by linear interpolation pixel outputs at imaginary positions from neighboring pixel outputs which are present actually. Arithmetic equations are selectively used depending on the signs of $\Delta Z_T/P+\Delta g$, $\Delta Z_T/(P\times\sqrt{2})+\Delta r$, and $\Delta Z_T/(P\times\sqrt{2})+\Delta b$.

If the image sensing areas 820a and 820d have horizontal pitch a=P, vertical pitch b=P, constant c=900, and positive integer h=1 on the light-receiving surface, these areas have a positional relationship in which they are separated $a \times h \times c$ in the horizontal direction and $b \times c$ in the vertical direction within the light-receiving surface. Hence, pixels always form lines in the direction in which misregistration occurs, and misregistration caused by a change in temperature can be corrected by very simple arithmetic operations.

Note that the registration temperature coefficients of R and B images are $1/\sqrt{2}$ of the registration temperature coefficient $K_T$ between G images in association with the ratio between the optical axis distances of the imaging systems. That is, the distance from the lens portion 800a to the lens portion 800b or 800c is $1/\sqrt{2}$ of the distance from the lens portion 800a to the lens portion 800d and, as a result, misregistration also becomes $1/\sqrt{2}$.

Generate $G2_T(i,j)$ (1) when $\Delta Z_T/P+\Delta g \leq 0$ $$G2_T(i,j)=(1-(\Delta Z_T/P+\Delta g))\times G2(i,j)+(\Delta Z_T/P+\Delta g)\times G2(i-1,j+1) \tag{4}$$

(2) when $\Delta Z_T/P+\Delta g > 0$ $$G2_T(i,j)=(1-(\Delta Z_T/P+\Delta g))\times G2(i,j)+(\Delta Z_T/P+\Delta g)\times G2(i+1,j-1) \tag{5}$$

Generate $R_T(i,j)$ (3) when $\Delta Z_T/(P\times\sqrt{2})+\Delta r \leq 0$ $$R_T(i,j)=(1-(\Delta Z_T/(P\times\sqrt{2})+\Delta r))\times R(i,j)+(\Delta Z_T/(P\times\sqrt{2})+\Delta r)\times R(i,j+1) \tag{6}$$

(4) when $\Delta Z_T/(P\times\sqrt{2})+\Delta r > 0$ $$R_T(i,j)=(1-(\Delta Z_T/(P\times\sqrt{2})+\Delta r))\times R(i,j)+(\Delta Z_T/(P\times\sqrt{2})+\Delta r)\times R(i,j-1) \tag{7}$$

Generate $B_T(i,j)$ (5) when $\Delta Z_T/(P\times\sqrt{2})+\Delta b \leq 0$ $$B_T(i,j)=(1-(\Delta Z_T/(P\times\sqrt{2})+\Delta g))\times B(i,j)+(\Delta Z_T/(P\times\sqrt{2})+\Delta g)\times B(i+1,j) \tag{8}$$

(6) when $\Delta Z_T/(P\times\sqrt{2})+\Delta b > 0$ $$B_T(i,j)=(1-(\Delta Z_T/(P\times\sqrt{2})+\Delta g))\times B(i,j)+(\Delta Z_T/(P\times\sqrt{2})+\Delta g)\times B(i,j-1) \tag{9}$$

The interpolated image signals $G2_T(i,j)$, $R_T(i,j)$, and $B_T(i,j)$ obtained by the aforementioned processes are used in the second correction process.

The second interpolation process generates G, R, and B image signals $G'(m,n)$, $R'(m,n)$, and $B'(m,n)$ each having a resolution of 1200×1600 pixels from the image signal $G1(i,j)$ and interpolated image signals $G2_T(i,j)$, $R_T(i,j)$, and $B_T(i,j)$ each having a resolution of 600×800 pixels. Equations (10) to (21) below describe arithmetic operations for generating pixel outputs at dataless positions by averaging neighboring pixel outputs.

Generate $G'(m,n)$ (1) when m: even number and n: odd number $$G'(m,n)=G2_T(m/2,(n+1)/2) \tag{10}$$

(2) when m: odd number and n: even number $$G'(m,n)=G1((m+1)/2,n/2) \tag{11}$$

(3) when m: even number and n: even number $$G'(m,n) = (G1(m/2, n/2) + G1(m/2+1, B/2) + \\ G2_T(m/2, n/2) + G2_T(m/2, n/2+1))/4 \tag{12}$$

(4) when m: odd number and n: odd number $$G'(m,n) = \tag{13}$$
$$(G1((m+1)/2, (n-1)/2) + G1((m+1)/2, (n-1)/2+1) + \\ G2_T((m-1)/2, (n+1)/2) + G2_T((m-1)/2+1, (n+1)/2))/4$$

Generate $R'(m,n)$ (5) when m: even number and n: odd number $$R'(m,n)=(R_T(m/2,(n+1)/2)+R_T(m/2+1,(n+1)/2)/2 \tag{14}$$

(6) when m: odd number and n: even number $$R'(m,n)=(R_T((m+1)/2,n/2)+R_T((m+1)/2,n/2+1)/2 \tag{15}$$

(7) when m: even number and n: even number $$R'(m,n)=(R_T(m/2,n/2)+R_T(m/2+1,n/2)+R_T(m/2,n/2+1)+R_T(m/2+1,n/2+1))/4 \quad (16)$$

(8) when m: odd number and n: odd number $$R'(m,n)=R_T((m+1)/2,(n+1)/2) \quad (17)$$

Generate B'(m,n)

(9) when m: even number and n: odd number $$B'(m,n)=(B_T(m/2,(n-1)/2)+B_T(m/2,(n-1)/2+1))/2 \quad (18)$$

(10) when m: odd number and n: even number $$B'(m,n)=(B_T((m-1)/2,n/2)+B_T((m-1)/2+1,n/2))/2 \quad (19)$$

(11) when m: even number and n: even number $$B'(m,n)=B_T(m/2,n/2) \quad (20)$$

(12) when m: odd number and n: odd number $$R'(m,n)=(R_T(m/2,n/2)+R_T(m/2+1,n/2)+R_T(m/2,n/2+1)+R_T(m/2+1,n/2+1))/4 \quad (21)$$

As described above, after the first interpolation process executes position correction of at least one of the output images of the plurality of image sensing areas, the second interpolation process forms a composite image signal on the basis of the output images of the plurality of image sensing areas.

The subsequent luminance and color difference signal processes using G'(m,n), R'(m,n), and B'(m,n) are the same as those in a normal digital color camera.

The operation of the camera will be described below. Upon photographing, the camera is used while attaching the contact protection cap 200 that protects the connection terminal 114 of the camera main body 101. When the contact protection cap 200 is attached to the camera main body 101, it serves as a camera grip, and allows the user to easily hold the camera.

When the main switch 105 is turned on, a power supply voltage is supplied to the respective units to allow their operation. Subsequently, it is checked if an image signal can be recorded on a memory. In this case, a photographable count is displayed on the indicator 150 in accordance with the remaining capacity of the memory. If photographing is possible based on the display, the operator directs the camera to an object field and presses the release button 106.

When the operator has pressed the release button 106 to its half-stroke position, the first-stage circuit of the switch 121 is closed to calculate an exposure time. Upon completion of all photographing preparation processes, the camera is ready to photograph, and informs the photographer of that message. When the photographer has pressed the release button 106 to its full-stroke position, the second-stage circuit of the switch 121 is closed, and an operation detection circuit (not shown) sends that detection signal to the system controller. In this case, an elapse of the exposure time calculated in advance is counted, and after an elapse of the predetermined exposure time, a timing signal is supplied to the solid-state image sensing element driving circuit. In response to this signal, the solid-state image sensing element driving circuit generates horizontal and vertical driving signals to sequentially read out 800×600 exposed pixels of all the image sensing areas in the horizontal and vertical directions.

In this case, the photographer holds the contact protection cap 200, and presses the release button 106 while pinching the camera main body 101 with the index and thumb fingers of the right hand. Since a projection 106a is formed integrally with the release button 106 on a central line L2 of the axis of the release button 106, and the projection 120 is formed on the back cover 125 at an extended position of the central line L2, the photographer makes release operation, i.e., push the projections 106a and 120 by feeling around them by the index and thumb fingers, respectively. In this way, generation of a couple 129 shown in FIG. 3 can be easily prevented, and a high-quality image free from any blurring can be sensed.

The readout pixels are converted into digital signals of a predetermined bit value by the A/D converter 500, and the digital signals are sequentially supplied to the RGB image processing circuit 210 of the image processing system 20. The RGB image processing circuit 210 executes the interpolation processes of these pixels after white balance adjustment and gamma correction, and supplies the processed signals to the YC processing circuit 230.

In the YC processing circuit 230, the high- and low-frequency luminance signal generation circuits respectively compute high- and low-frequency luminance signals YH and YL of the R, G, and B pixels. Each high-frequency luminance signal YH as the computation result is output to an adder via a low-pass filter. Likewise, each low-frequency luminance signal YL is output to the adder via the low-pass filter after the high-frequency luminance signal YH is subtracted therefrom. In this manner, the high-frequency luminance signal YH and its difference YL-YH from the low-frequency luminance signal are added to obtain a luminance signal Y. Also, the color difference signal generation circuit computes and outputs color difference signals R-Y and B-Y. The output color difference signals R-Y and B-Y are filtered by low-pass filters, and are then supplied to the recording processing circuit 300.

Upon receiving the YC signals, the recording processing circuit 300 compresses each luminance signal Y and color difference signals R-Y and B-Y by a predetermined still image compression scheme, and records them on a memory.

Upon reproducing an image from an image signal which is recorded on the memory and represents a still image or moving image, when the operator has pressed a reproduction button 9, the operation detection circuit 430 detects that operation, and supplies a detection signal to the system controller 400. In this manner, the recording processing circuit 300 is driven. The driven recording processing circuit 300 reads out the recorded contents from the memory and displays an image on the liquid crystal monitor 4. The operator selects a desired image by pressing, e.g., a select button.

Second Embodiment

In the first embodiment, misregistration caused by changes in the image sensing system 10 (890) due to a change in temperature is corrected based on the output from the temperature sensor 165. Misregistration also occurs due to a change in object distance. The second embodiment corrects such misregistration caused by a change in object distance.

Figure 21:
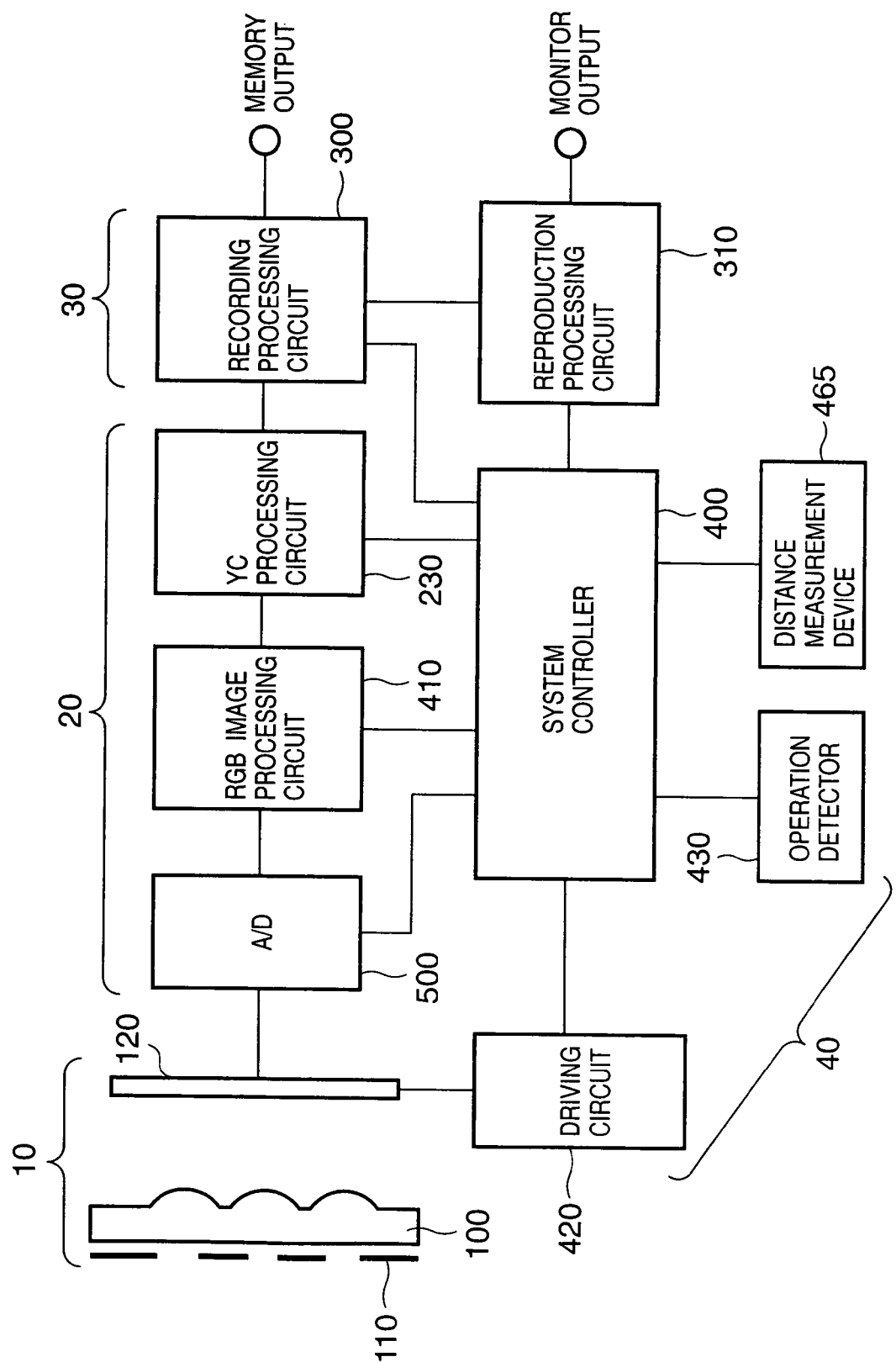
FIG. 21 is a block diagram showing a signal processing system which uses the output from a distance measurement device in correction of misregistration.

FIG. 21 shows a signal processing system which uses an output from a distance measurement device to correct misregistration. The same reference numerals denote the same components as those in the first embodiment.

As shown in FIG. 21, an image sensing apparatus has an image sensing system 10, an image processing system 20 as image processing means, a recording/reproduction system 30, and a control system 40. Furthermore, the image sensing system 10 includes a photographing lens 100, stop 110, and solid-state image sensing element 120. The image processing system 20 includes an A/D converter 500, RGB image processing circuit 410, and YC processing circuit 230. The recording/reproduction system 30 includes a recording processing circuit 300 and reproduction processing circuit 310. The control system 40 includes a system controller 400, operation detector or detection circuit 430, distance measurement device 465, and solid-state image sensing element driving circuit 420.

The distance measurement device 465 can adopt an active distance measurement device which outputs distance by projecting ultrasonic waves or LED light to an object, or a passive distance measurement device which outputs distance based on the principle of triangulation using an object image.

The image sensing system 10 is an optical processing system for forming an optical image coming from an object on the image sensing surface of the solid-state image sensing element 120 via the stop 110 and photographing lens 100, and exposes the solid-state image sensing element 120 to an object image. As described above, the solid-state image sensing element 120 effectively uses an image sensing device such as a CCD, CMOS sensor, or the like, and an image signal that represents a moving image sequence or an image signal that represents a still image by one-shot exposure can be obtained by controlling the exposure time and interval of the solid-state image sensing element 120.

As in the first embodiment, the solid-state image sensing element 120 is an image sensing device which has 800 pixels in the longitudinal direction×600 pixels in the widthwise direction of each image sensing area, i.e., a total of 1.92 million pixels. Optical filters of three primary colors, i.e., red (R), green (G), and blue (B) are arranged on the front surface of the image sensing element 120 for respective areas. Both the vertical and horizontal pixel pitches are 1.56 μm.

As shown in FIG. 21, image signals read out from the solid-state image sensing element 120 are supplied to the image processing system 20 via the A/D converter 500. The A/D converter 500 is a signal conversion circuit for converting an input signal into, e.g., a 10-bit digital signal in accordance with the amplitude of a signal of each exposed pixel, and outputting the digital signal, and the subsequent image signal processes are implemented by digital processes.

The image processing system 20 is a signal processing circuit for obtaining an image signal of a desired format from R, G, and B digital signals, and converts R, G, and B color signals into YC signals including a luminance signal Y and color difference signals (R-Y) and (B-Y), or the like.

The RGB image processing circuit 410 is a signal processing circuit for processing image signals of 800×600×4 pixels received from the solid-state image sensing element 120 via the A/D converter 500, and has a white balance circuit, gamma correction circuit, and interpolation arithmetic circuit for achieving high resolution by interpolation.

The YC processing circuit 230 is a signal processing circuit for generating a luminance signal Y and color difference signals R-Y and B-Y. The circuit 230 comprises a high-frequency luminance generation circuit for generating a high-frequency luminance signal YH, a low-frequency luminance signal generation circuit for generating a low-frequency luminance signal YL, and a color difference signal generation circuit for generating color difference signals R-Y and B-Y. The luminance signal Y is formed by mixing the high- and low-frequency luminance signals YH and YL.

The recording/reproduction system 30 is a processing system for outputting an image signal to a memory, and outputting an image signal to a liquid crystal monitor 4. The system 30 includes the recording processing circuit 300 for executing read/write processes of an image signal from/to a memory, and the reproduction processing circuit 310 for reproducing an image signal read out from the memory, and outputting the reproduced signal to the monitor. More specifically, the recording processing circuit 300 includes a compression/expansion circuit for compressing YC signals, which represent a still image and moving image, in a predetermined compression format, and expanding compressed data when it is read out.

The compression/expansion circuit has a frame memory and the like for signal processes, stores YC signals from the image processing system 20 in this frame memory for respective frames, reads out the stored signals for a plurality of blocks, and encodes them by compression coding. Compression coding is implemented by performing two-dimensional orthogonal transformation, normalization, and Huffman coding of image signals for respective blocks.

The reproduction processing circuit 310 is a circuit for converting the luminance signal Y and color difference signals R-Y and B-Y using a matrix into, e.g., R, G, and B signals. The signals converted by the reproduction processing circuit 310 are output to the liquid crystal monitor 4, thus displaying and reproducing a visible image.

The control system 40 includes control circuits of respective units for controlling the image sensing system 10, image processing system 20, and recording/reproduction system 30 in response to an external operation, and controls driving of the solid-state image sensing element 120, the operation of the RGB image processing circuit 410, the compression process of the recording processing circuit 300, and the like upon detection of pressing of a release button 6. More specifically, the control system 40 includes the operation detector 430 for detecting the operation of the release button 6, the system controller 400 for controlling respective units in response to a detection signal from the detector, and generating and outputting timing signals and the like upon sensing an image, and the solid-state image sensing element driving circuit 420 for generating a driving signal used to drive the solid-state image sensing element 120 under the control of the system controller 400.

The RGB image processing circuit 410 executes the following processes. The white balance circuit in the RGB image processing circuit 410 executes predetermined white balance correction of R, G, and B signals output via the A/D converter 500 in correspondence with R, G, and B regions, and the gamma correction circuit executes predetermined gamma correction for these signals. The interpolation arithmetic circuit in the RGB image processing circuit 410 executes an interpolation process and distortion correction of image signals from the solid-state image sensing element 120 to generate R, G, and B image signals each having a resolution of 1200×1600, and supplies these signals to the subsequent high- and low-frequency luminance signal generation circuits and color difference signal generation circuit.

This interpolation process includes a first interpolation process for correcting misregistration caused by a change in object distance, and a second interpolation process for forming a composite image signal by setting R, G, and B image signals to have an identical resolution.

The subsequent distortion correction is an arithmetic process for correcting distortion of the photographing optical system by a known scheme. In this case, since R, G, and B object images have identical magnifications and distortions depending on setups of the photographing lens 100, they can undergo unique distortion correction. By correcting the distortion of the photographing optical system by arithmetic operations, the arrangement of the photographing lens 100 can be optimized to correct other optical aberrations.

Details of the first interpolation process are as follows. In the following description, an object distance will be examined with reference to the imaging system for the sake of simplicity. A registration change amount $\Delta Z_S$ between the image sensing areas 820a and 820b can be expressed as a function of a difference ΔS between an actual object distance and reference object distance St by:

$$\Delta Z_S = d_O \cdot S' \cdot \Delta S / \{St \cdot (\Delta S + St)\} \quad (22)$$

The difference ΔS is obtained from the output of the distance measurement device 465.

Assuming that arrangement of the image sensing system is the same as that in the first embodiment, the spacing $d_O$ of lens portions=1.9832 [m], the reference object distance St=2380−1.45=2378.55 [mm], and the spacing S' between the imaging system and image sensing area=1.45 [m].

Figure 22:
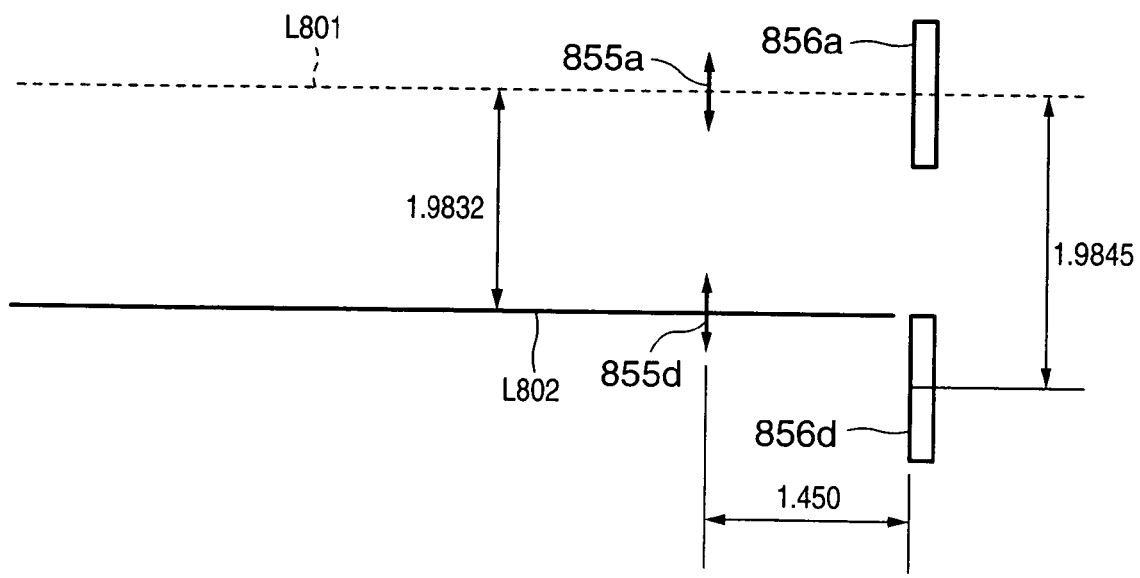
FIG. 22 is a view showing the optical path when an actual object distance increases to infinity.

FIG. 22 shows an optical path when the actual object distance increases to infinity. Each image sensing area has a size of 1.248 mm×0.936 mm, and the image sensing areas neighbor in the horizontal direction via a 0.156 mm (horizontal)× 0.468 mm (vertical) separation band. The spacing between the centers of the neighboring image sensing areas is 1.404 mm in the vertical and horizontal directions, and is 1.9856 mm in the diagonal direction.

Paying attention to the image sensing areas 820a and 820d, assume that an image of an object located at a position of a reference object distance is formed on the image sensing portion at intervals of 1.9845 mm obtained by subtracting the diagonal size for a 0.5 pixel from 1.9856 mm as the image sensing area spacing so as to implement pixel shift. As a result, the spacing between the lens portions 800a and 800d of the photographing lens 800 is set at 1.9832 mm, as shown in FIG. 22. In FIG. 22, arrows 855a and 855d are symbols that represent imaging systems having a positive power by the lens portions 800a and 800d of the photographing lens 800, rectangles 856a and 856d are symbols that represent the ranges of the image sensing areas 820a and 820d, and L801 and L802 indicate optical axes of the imaging systems 855a and 855d.

The difference ΔS between the actual object distance and reference object distance St is infinity. When ΔS→∞, the limit of equation (22) is:

$$\lim_{\Delta S \to \infty} \Delta Z_S = \frac{d_O \cdot S'}{St.} = \frac{1.9832 \times 1.45}{2378.55} = 0.0012 \text{ [mm]} \quad (23)$$

As can be seen from this equation, misregistration of 0.0012 [mm] is produced. If one unit is expressed by one pixel pitch (px1), the registration change amount is given by $\Delta Z_S/P$ using the pixel pitch P.

An actual first interpolation process for correcting misregistration due to a change in object distance mentioned above is done as follows. As in the first embodiment, let G1(i,j), R(i,j), B(i,j), and G2(i,j) be image signals from the image sensing areas 820a, 820b, 820c, and 820d, and addresses are defined, as shown in FIG. 20.

Interpolated image signals $G2_S(i,j)$, $R_S(i,j)$, and $B_S(i,j)$ of G2(i,j), R(i,j), and B(i,j) are generated with reference to the image signal G1(i,j) of the imaging system 855a (lens portion 800a) on the basis of equations (24) to (29) below. Equations (24) to (29) are used to generate pixel outputs at imaginary positions from neighboring pixel outputs which are present actually by linear interpolation. If P represents the pixel pitch, and the image sensing areas 820a and 820d have horizontal pitch a=P, vertical pitch b=P, constant c=900, and positive integer h=1 on the light-receiving surface, these areas have a positional relationship in which they are separated a×h×c in the horizontal direction and b×c in the vertical direction within the light-receiving surface. Hence, misregistration caused by a change in temperature or a change in object distance can be corrected by very simple arithmetic operations.

Note that misregistration between R and B images are 1/√2 of that between G images in association with the ratio between the optical axis distances of the imaging systems.

Generate $G2_S(i,j)$
(1) when $\Delta Z_S \geq 0$ $$G2_S(i,j) = (1 - \Delta Z_S/P) \times G2(i,j) + (\Delta Z_S/P) \times G2(i-1,j+1) \quad (24)$$

(2) when $\Delta Z_S < 0$ $$G2_S(i,j) = (1 - \Delta Z_S/P) \times G2(i,j) + (Z_S/P) \times G2(i+1,j-1) \quad (25)$$

Generate $R_S(i,j)$
(3) when $\Delta Z_S \geq 0$ $$R_S(i,j) = (1 - \Delta Z_S/(P \times \sqrt{2})) \times R(i,j) + (\Delta Z_S/(P \times \sqrt{2})) \times R(i,j+1) \quad (26)$$

(4) when $\Delta Z_S < 0$ $$R_S(i,j) = (1 - \Delta Z_S/(P \times \sqrt{2})) \times R(i,j) + (\Delta Z_S/(P \times \sqrt{2})) \times R(i,j-1) \quad (27)$$

Generate $B_S(i,j)$
(3) when $\Delta Z_S \geq 0$ $$B_S(i,j) = (1 - \Delta Z_S/(P \times \sqrt{2})) \times B(i,j) + (\Delta Z_S/(P \times \sqrt{2})) \times B(i+1,j) \quad (28)$$

(4) when $\Delta Z_S < 0$ $$B_S(i,j) = (1 - (\Delta Z_S/(P \times \sqrt{2})) \times B(i,j) + (\Delta Z_S/(P \times \sqrt{2})) \times B(i,j-1) \quad (29)$$

The interpolated image signals $G2_S(i,j)$, $R_S(i,j)$, and $B_S(i,j)$ obtained by the aforementioned processes are free from any misregistration caused by a change in object distance, and are then used in the second correction process.

Third Embodiment

In the second embodiment, misregistration caused by a change in object distance is corrected on the basis of the output from the distance measurement device 465. In the third embodiment, such misregistration is corrected without using the output from the distance measurement device 465.

A switch 109 (FIG. 2) which is used by the user to set up the state of the camera is used as a macro photographing mode setting switch. When a near-distance object is to be photographed as the next object, the photographer presses the macro photographing mode setting switch 109. Upon detection of pressing of the macro photographing mode setting switch 109 by the operation detection circuit 430, for example, an interpolation process is done while the difference ΔS from the reference object distance St is set at −1.19 [m]. That is, $\Delta Z_S$ is calculated while ΔS=−1.19 in equation (22), and an interpolation process is executed based on equations (24) to (29).

With this arrangement, since no distance measurement device is required, a cost reduction can be attained.

In addition, it is advantageous to achieve a compact, low-profile camera.

Fourth Embodiment

Misregistration caused by a change in temperature is corrected based on the output from the temperature sensor 165 in the first embodiment, and that caused by a change in object distance is corrected based on the output from the distance measurement device 465 in the second embodiment. In the fourth embodiment, misregistration is corrected based on the output itself from the solid-state image sensing element without using the outputs from the temperature sensor 165 and distance measurement device 465. At this time, deviation of images caused by disparity is detected by exploiting correlation in an oblique direction between two G image sensing areas. With this arrangement, misregistration caused by a change in temperature, that caused by a change in object distance, and that caused by manufacturing errors of the photographing lens can be corrected together.

Figure 23:
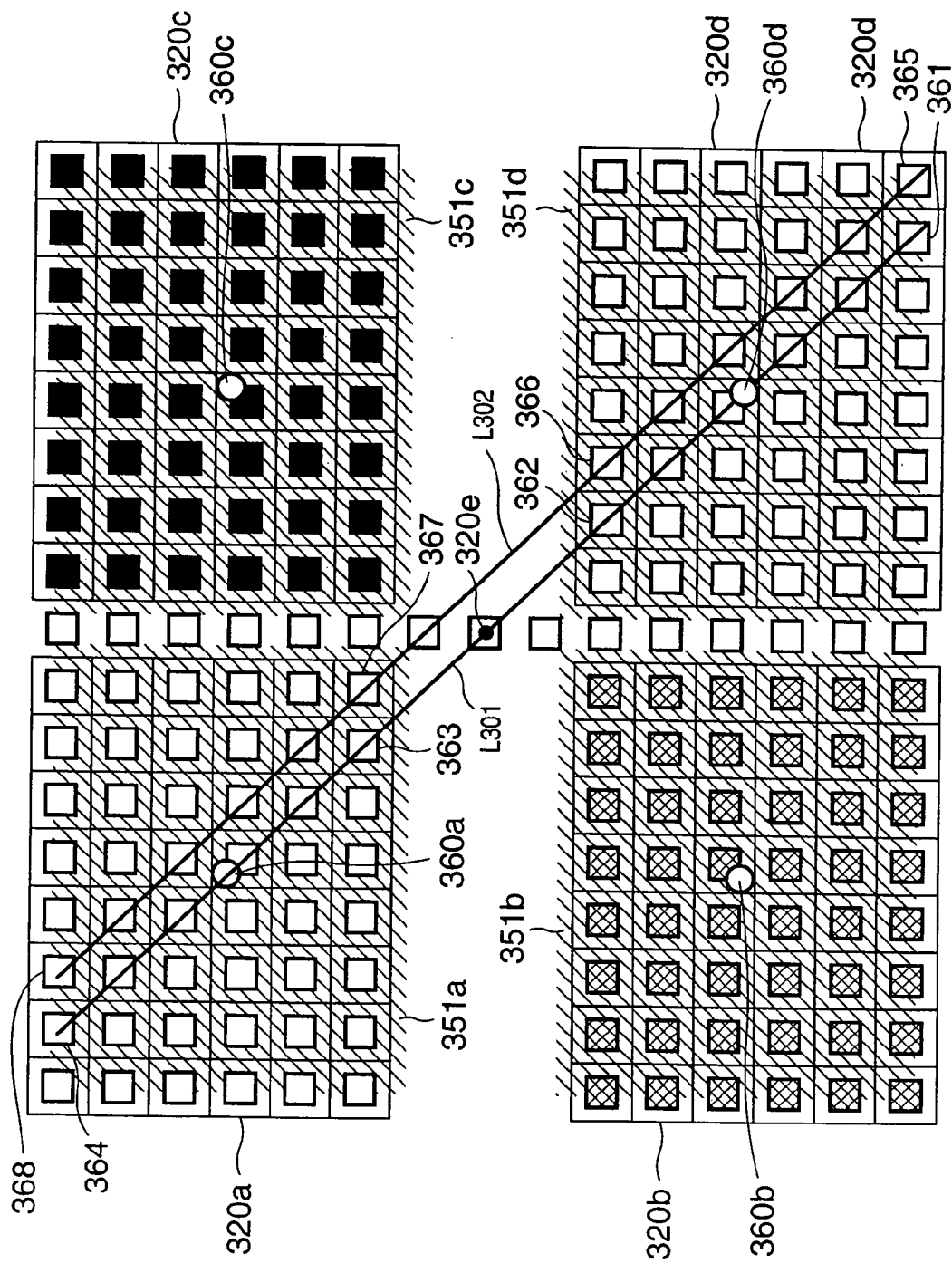
FIG. 23 is a view for explaining pixels on the solid-state image sensing element used to detect misregistration.

FIG. 23 is a view for explaining pixels on the solid-state image sensing element, which are used to detect misregistration. FIG. 23 shows the positional relationship between the object images and image sensing areas while reducing the numbers of pixels to 1/100 in the vertical and horizontal directions.

Referring to FIG. 23, reference numerals 320a, 320b, 320c, and 320d denote four image sensing areas of the solid-state image sensing element 820. For the sake of simplicity, each of the image sensing areas 320a, 320b, 320c, and 320d has an 8×6 pixel matrix. The image sensing areas 320a and 320d, 320b, and 320c respectively output G, R, and B image signals. Pixels in the image sensing areas 320a and 320d are indicated by open rectangles, those in the image sensing area 320b are indicated by hatched rectangles, and those in the image sensing area 320c are indicated by closed rectangles.

A separation band having a size of one pixel (horizontal)×3 pixels (vertical) is formed between neighboring image sensing areas. Therefore, the distances between the centers of the image sensing areas for outputting G images are equal to each other in the horizontal and vertical directions.

Reference numerals 351a, 351b, 351c, and 351d denote object images. To attain a pixel shift, centers 360a, 360b, 360c, and 360d of the object images 351a, 351b, 351c, and 351d are offset ¼ pixels from the centers of the image sensing areas 320a, 320b, 320c, and 320d in the direction of a center 320e of the entire image sensing area.

As a result, upon projecting the image sensing areas backward onto a plane at a predetermined distance on the object field side, backward projected images of the centers 360a, 360b, 360c, and 360d of the object images overlap each other, and those of the pixels of the image sensing areas 320a, 320b, 320c, and 320d are laid out in a mosaic pattern so that their centers do not overlap each other.

Reference numerals L301 and L302 denote line segments which represent pixel sequences used to detect misregistration. Since both the image sensing areas 320a and 320d output G images, signals from a pixel sequence which are located within the image sensing area 320a and under the line segment L301 form a shape similar to that formed by signals from a pixel sequence which are located within the image sensing area 320d and under the line segment L301. When these pixel signals undergo correlation arithmetic operations, misregistration between the image sensing areas 320a and 320d can be detected. Likewise, by making correlation arithmetic operations of signals from a pixel sequence which are located within the image sensing area 320a and under the line segment L302, and signals from a pixel sequence which are located within the image sensing area 320d and under the line segment L302, misregistration between the image sensing areas 320a and 320d can also be detected.

In this embodiment, misregistration amounts are calculated using two pairs of image signals, and the calculation results are averaged to improve the detection precision.

FIG. 24 shows signals from a pixel sequence which are located within the image sensing area 320a and under the line segment L301, and those from a pixel sequence which are located within the image sensing area 320d and under the line segment L301. In FIG. 24, signals 370 indicated by black dots are those from a pixel sequence which are located within the image sensing area 320a and under the line segment L301, and signals 371 indicated by white dots are those from a pixel sequence which are located within the image sensing area 320d and under the line segment L301. Especially, reference numeral 361' denotes an output from a pixel 361 in FIG. 23; 362', an output from a pixel 362; 363', an output from a pixel 363; and 364', an output from a pixel 364. All these signals are components of a G image signal. More specifically, since the signals 370 and 371 have identical spectrum distributions in color characteristics, the correlation arithmetic operation result indicates an image signal shift with very high precision.

FIG. 25 shows signals from a pixel sequence which are located within the image sensing area 320a and under the line segment L302, and those from a pixel sequence which are located within the image sensing area 320d and under the line segment L302. In FIG. 25, signals 372 indicated by black dots are those from a pixel sequence which are located within the image sensing area 320a and under the line segment L302, and signals 373 indicated by white dots are those from a pixel sequence which are located within the image sensing area 320d and under the line segment L302. Especially, reference numeral 365' denotes an output from a pixel 365 in FIG. 23; 366', an output from a pixel 366; 367', an output from a pixel 367; and 368', an output from a pixel 368. All these signals are also components of a G image signal. That is, the signals 372 and 373 have identical spectrum distributions in color characteristics.

FIGS. 24 and 25 show states which are free from any change in temperature, and in which an object is located at a position of the reference object distance. In these states, the signals relatively laterally deviate 0.5 pixels from each other as a result of pixel shift.

When a change in temperature has occurred or when the object is separated from the position of the reference object distance with respect to the above states, signal shift takes place. For example, when the object is farther than the reference object distance position, the signals 370 (372) and 371 (373) respectively shift in the directions of arrows A and B in FIG. 24 (25); when the object is closer than the reference object distance position, they shift in opposite directions. This behavior is described by equation (22) as a function of the difference $\Delta S$ between the actual object distance and reference object distance St.

A relative position change amount between a pair of signals having identical spectral distributions in color characteristics can be detected using a known method that adopts correlation arithmetic operations, e.g., using a scheme disclosed in Japanese Patent Publication No. 5-88445. By subtracting a design shift amount "0.5" from that output, the registration change amount $\Delta Z_S/P$ that expresses one unit as one pixel pitch (px1) is obtained.

Normally, high-frequency components beyond the Nyquist frequency of the solid-state image sensing element 820 are projected onto the image sensing element 820 in terms of the characteristics of the optical system. Therefore, the object image phase is not always perfectly reflected in the signal phase depending on object patterns. In order to eliminate detection errors of the registration change amount $\Delta Z_S/P$ resulting from such characteristics, the registration change amount obtained from signals from a pixel sequence located under the line segment L301 and that obtained from signals from a pixel sequence located under the line segment L302, which has an object image sampling position shifted 0.5 pixels from that under the line segment L301, are averaged. Since the obtained registration change amount has high precision, the first interpolation process described by equations (24) to (29) can be ideally done using that amount.

The interpolated image signals $G2_S(i,j)$, $R_S(i,j)$ and $B_S(i,j)$ obtained by the aforementioned processes are used in the second correction process.

Unlike in the second embodiment, the interpolated image signals $G2_S(i,j)$, $R_S(i,j)$, and $B_S(i,j)$ have undergone corrections of misregistration caused by a change in temperature, that caused by a change in object distance, and that caused by manufacturing errors of the photographing lens together in this case.

The subsequent second interpolation process generates G, R, and B image signals G'(m,n), R'(m,n), and B'(m,n) each having a resolution of 1200×1600 pixels from the image signal $G1(i,j)$ and interpolated image signals $G2_T(i,j)$, $R_T(i,j)$, and $B_T(i,j)$ each having a resolution of 600×800 pixels. In this embodiment, $G2_T(i,j)$, $R_T(i,j)$, and $B_T(i,j)$ in equations (10) to (21) in the first embodiment are replaced by $G2_S(i,j)$, $R_S(i,j)$, and $B_S(i,j)$.

As described above, the image sensing element outputs two G images which are formed to have identical spectral distributions and have substantially the same fields of view, and R and B images which have substantially the same fields of view as the two G images, the positions of the R and B images are corrected based on a change in spacing between the two G images in the first interpolation process, and a composite image signal is formed based on the R, G, and B images in the second interpolation process.

If area-based matching disclosed in Japanese Patent Laid-Open No. 10-289316 is used, misregistration can be obtained for respective pixels. When misregistration is corrected using such scheme, even when an object has a depth, an image which is free from color misregistration over the entire frame and has high sharpness can be obtained. In this case, $\Delta Z_S$ in equations (24) to (29) can be processed as a function of a pixel address.

Figure 26:
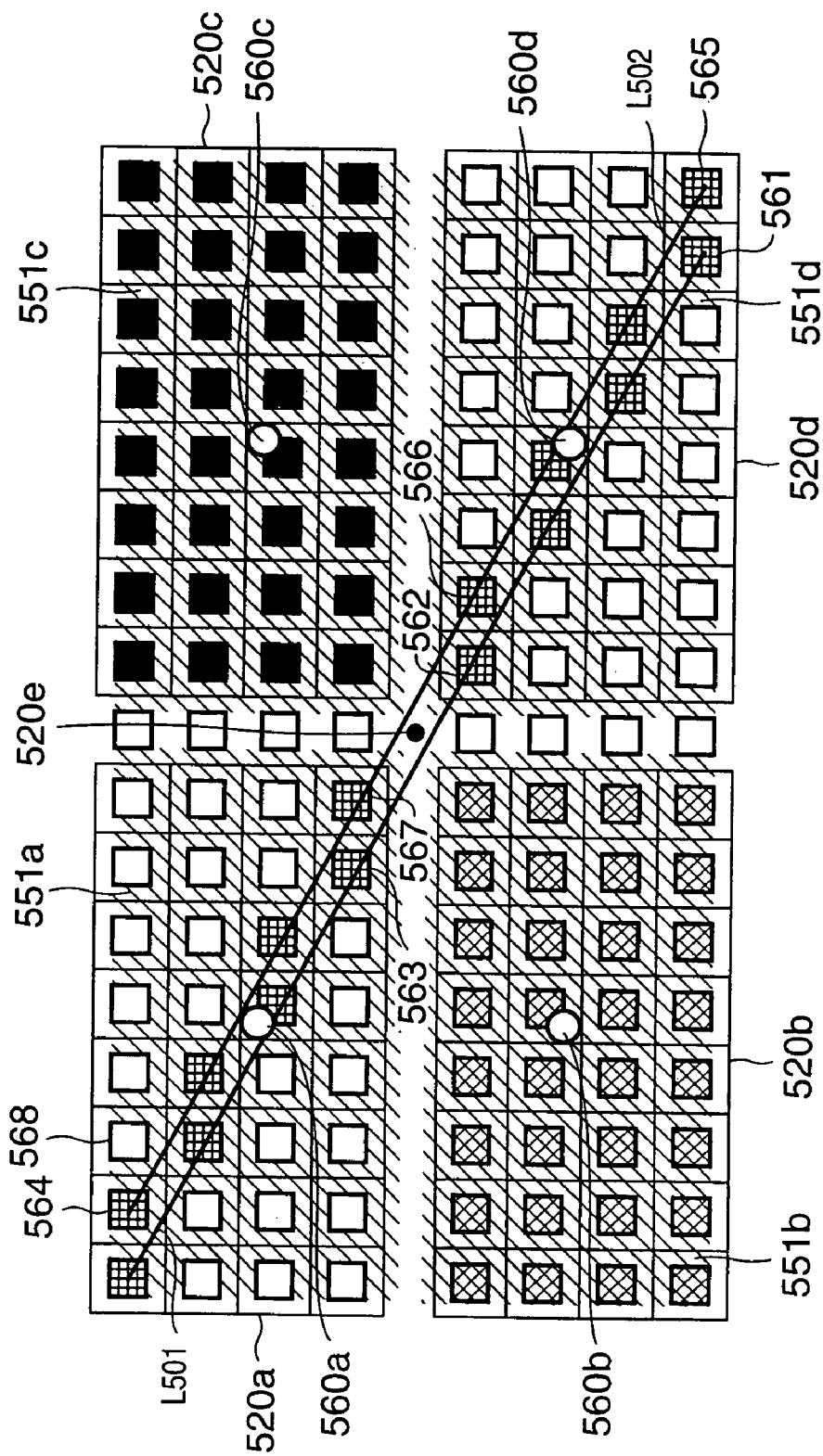
FIG. 26 is a view for explaining pixels on the solid-state image sensing element used to detect misregistration.

FIG. 26 is a view for explaining another setup of pixels on the solid-state image sensing element used to detect misregistration.

Referring to FIG. 26, reference numerals 520a, 520b, 520c, and 520d denote four image sensing areas of the solid-state image sensing element 820. For the sake of simplicity, each of the image sensing areas 520a, 520b, 520c, and 520d has an 8×4 pixel matrix, but the number of pixels is increased to obtain a practical resolution in practice. The image sensing areas 520a and 520d, 520b, and 520c respectively output G, R, and B image signals. Pixels in the image sensing areas 520a and 520d are indicated by open rectangles, those in the image sensing area 520b are indicated by hatched rectangles, and those in the image sensing area 520c are indicated by closed rectangles.

A separation band having a size of one pixel (horizontal)× zero pixel (vertical) is formed between neighboring image sensing areas. Therefore, the distances between the centers of the two image sensing areas for outputting G images are 9 pixels in the horizontal direction and 4.5 pixels in the vertical direction. If the image sensing areas 820a and 820d have horizontal pitch a=P, vertical pitch b=P, constant c=4.5, and positive integer h=2 on the light-receiving surface, these areas have a positional relationship in which they are separated a×h×c in the horizontal direction and b×c in the vertical direction within the light-receiving surface. With this relationship, since misregistration caused by a change in temperature or a change in object distance takes place in a direction in which pixels are arranged, such misregistration can be corrected by very simple arithmetic operations.

Reference numerals 551a, 551b, 551c, and 551d denote object images. To attain pixel shift, centers 560a, 560b, 560c, and 560d of the object images 551a, 551b, 551c, and 551d are offset ¼ pixels in the vertical and horizontal directions from the centers of the image sensing areas 520a, 520b, 520c, and 520d in the direction to approach a center 520e of the entire image sensing area.

As a result, upon projecting the image sensing areas backward onto a plane at a predetermined distance on the object field side, backward projected images of the centers 560a, 560b, 560c, and 560d of the object images overlap each other, and those of the pixels of the image sensing areas 520a, 520b, 520c, and 520d are laid out in a mosaic pattern so that their centers do not overlap each other.

Reference numerals L501 and L502 denote line segments which represent pixel sequences used to detect misregistration. To help easy understanding, pixels used are hatched. Since both the image sensing areas 520a and 520d output G images, signals from a pixel sequence which are located within the image sensing area 520a and under the line segment L501 form a shape similar to that formed by signals from a pixel sequence which are located within the image sensing area 520d and under the line segment L501. When the correlation between these pixel signals is calculated, misregistration between the image sensing areas 520a and 520d can be detected. Likewise, by calculating the correlation between signals from a pixel sequence which are located within the image sensing area 520a and under the line segment L502, and signals from a pixel sequence which are located within the image sensing area 520d and under the line segment L502, misregistration between the image sensing areas 520a and 520d can also be detected.

In this embodiment, misregistration amounts are calculated using two pairs of image signals, and the calculation results are averaged to improve the detection precision.

When a change in temperature has occurred or when the object is separated from the position of the reference object distance with respect to the above states, signal shift takes place. This behavior is described by equation (22) as a function of the difference $\Delta S$ between the actual object distance and reference object distance St.

A relative position change amount between a pair of signals having identical spectral distributions in color characteristics can be detected using a known method that adopts correlation arithmetic operations, e.g., using a scheme disclosed in Japanese Patent Publication No. 5-88445. By subtracting a design shift amount "0.5" from that output, the registration change amount $\Delta Z_S/P$ that expresses one unit as one pixel pitch (px1) is obtained. Note that every other pixels must be used. Using the obtained registration change amount, the first interpolation process described by equations (24) to (29) can be implemented.

Upon reversing the aspect ratio of each image sensing area, a separation band having a size of one pixel (vertical)×zero pixel (horizontal) is formed between neighboring image sensing areas. Therefore, the distances between the centers of the two image sensing areas for outputting G images are 9 pixels in the vertical direction and 4.5 pixels in the horizontal direction. If these two image sensing areas have horizontal pitch a=P, vertical pitch b=P, constant c=4.5, and positive integer h=2 on the light-receiving surface, these areas have a positional relationship in which they are separated a×c in the horizontal direction and b×h×c in the vertical direction within the light-receiving surface.

Figure 27:
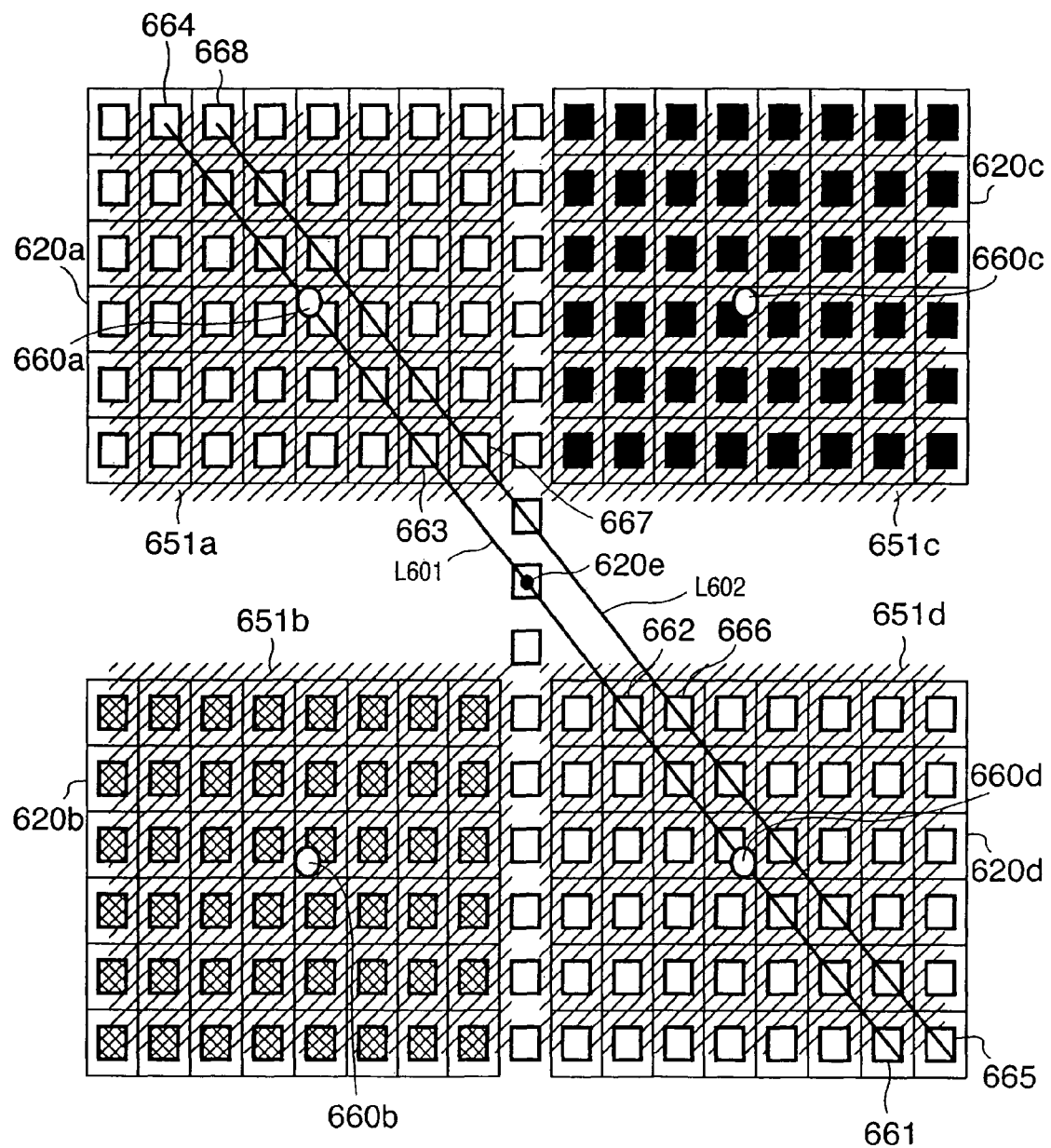
FIG. 27 is a view for explaining pixels on the solid-state image sensing element used to detect misregistration.

FIG. 27 is a view for explaining still another setup of pixels on the solid-state image sensing element used to detect misregistration.

Referring to FIG. 27, reference numerals 620a, 620b, 620c, and 620d denote four image sensing areas of the solid-state image sensing element 820. For the sake of simplicity, each of the image sensing areas 620a, 620b, 620c, and 620d has an 8×6 pixel matrix. The image sensing areas 620a and 620d, 620b, and 620c respectively output G, R, and B image signals. Pixels in the image sensing areas 620a and 620d are indicated by open rectangles, those in the image sensing area 620b are indicated by hatched rectangles, and those in the image sensing area 620c are indicated by closed rectangles.

A separation band having a size of one pixel (vertical)× three pixels (horizontal) is formed between neighboring image sensing areas. Therefore, the distances between the centers of the image sensing areas are equal to each other in the horizontal and vertical directions.

Reference numerals 651a, 651b, 651c, and 651d denote object images. To attain pixel shift, centers 660a, 660b, 660c, and 660d of the object images 651a, 651b, 651c, and 651d are offset ¼ pixels from the centers of the image sensing areas 620a, 620b, 620c, and 620d in the direction of a center 620e of the entire image sensing area.

As a result, upon projecting the image sensing areas backward onto a plane at a predetermined distance on the object field side, backward projected images of the centers 660a, 660b, 660c, and 660d of the object images overlap each other, and those of the pixels of the image sensing areas 620a, 620b, 620c, and 620d are laid out in a mosaic pattern so that their centers do not overlap each other.

Reference numerals L601 and L602 denote line segments which represent pixel sequences used to detect misregistration. Since both the image sensing areas 620a and 620d output G images, misregistration between the image sensing areas 620a and 620d can be detected by calculating the correlation between signals from a pixel sequence which are located within the image sensing area 620a and under the line segment L601, and signals from a pixel sequence which are located within the image sensing area 620d and under the line segment L601. Likewise, by calculating the correlation between signals from a pixel sequence which are located within the image sensing area 620a and under the line segment L602, and signals from a pixel sequence which are located within the image sensing area 620d and under the line segment L602, misregistration between the image sensing areas 620a and 620d can also be detected.

In this embodiment, misregistration amounts are calculated using two pairs of image signals, and the calculation results are averaged to improve the detection precision.

When a change in temperature has occurred or when the object is separated from the position of the reference object distance with respect to the above states, signal shift takes place. This behavior is described by equation (22) as a function of the difference $\Delta S$ between the actual object distance and reference object distance St.

A relative position change amount between a pair of signals having identical spectral distributions in color characteristics can be detected using a known method that adopts correlation arithmetic operations, e.g., using a scheme disclosed in Japanese Patent Publication No. 5-88445. By subtracting a design shift amount "0.5" from that output, the registration change amount $\Delta Z_S/P$ that expresses one unit as one pixel pitch (px1) is obtained. Note that every other pixels must be used. Using the obtained registration change amount, the first interpolation process described by equations (24) to (29) can be implemented.

Another Embodiment

Note that the present invention may be applied to either a system constituted by a plurality of devices (e.g., a host computer, interface device, reader, printer, and the like), or an apparatus consisting of a single equipment (e.g., a copying machine, facsimile apparatus, or the like).

The objects of the present invention are also achieved by supplying a storage medium (or recording medium), which records a program code of a software program that can implement the functions of the above-mentioned embodiments to the system or apparatus, and reading out and executing the program code stored in the storage medium by a computer (or a CPU or MPU) of the system or apparatus. In this case, the program code itself read out from the storage medium implements the functions of the above-mentioned embodiments, and the storage medium which stores the program code constitutes the present invention. The functions of the above-mentioned embodiments may be implemented not only by executing the readout program code by the computer but also by some or all of actual processing operations executed by an operating system (OS) running on the computer on the basis of an instruction of the program code.

Furthermore, the functions of the above-mentioned embodiments may be implemented by some or all of actual processing operations executed by a CPU or the like arranged in a function extension card or a function extension unit, which is inserted in or connected to the computer, after the program code read out from the storage medium is written in a memory of the extension card or unit.

As described above, in an image sensing apparatus which has a plurality of apertures for receiving external light from different positions, a plurality of image sensing means for independently receiving the external light received via the plurality of apertures, and independently extracting predetermined color components for each external light, and image processing means for processing an output signal from the image sensing means, the image processing means performs position correction of at least one of output images form the plurality of image sensing means, and then forms a composite image signal based on the output images from the plurality of image sensing means. Hence, the following effects are obtained.

(1) A position correction method of images suitable for an image sensing apparatus for a compact digital color camera can be obtained.

(2) As a result, a high-resolution image free from any color misregistration and sharpness drop can be easy obtained.

Furthermore, in an image sensing apparatus which has an image sensing element having a plurality of image sensing areas, a photographing optical system for forming object images on the plurality of image sensing areas via a plurality of imaging systems corresponding to the plurality of image sensing areas, image processing means for processing an output signal from the image sensing element, and temperature measurement means, the image sensing element outputs a plurality of images having substantially the same fields of view, and the image processing means performs position correction of at least one of the plurality of images on the basis of the output from the temperature measurement means, and then forms a composite image signal based on the plurality of images. Hence, the following effect can be obtained.

(3) A method suitable for correcting misregistration caused by a change in temperature can be obtained.

Moreover, in an image sensing apparatus which has an image sensing element having a plurality of image sensing areas, a photographing optical system for forming object images on the plurality of image sensing areas via a plurality of imaging systems corresponding to the plurality of image sensing areas, and image processing means for processing an output signal from the image sensing element, the image sensing element outputs a plurality of images having substantially the same fields of view, and the image processing means performs position correction of at least one of the plurality of images on the basis of object distance information, and then forms a composite image signal based on the plurality of images. Hence, the following effect can be obtained.

(4) A method suitable for correcting misregistration caused by a change in object distance can be obtained.

Also, upon setting a macro photographing mode, since position correction for at least one of the plurality of images is done, and a composite image signal is then formed based on the plurality of images, the following effects can be obtained.

(5) A method suitable for correcting misregistration caused by a change in object distance upon setting the macro photographing mode can be obtained.

(6) A distance measurement device can be omitted.

In addition, in an image sensing apparatus which has an image sensing element having a plurality of image sensing areas on a single plane, a photographing optical system for forming object images on the plurality of image sensing areas, respectively, and image processing means for processing an output signal from the image sensing element, the image sensing element outputs first and second images which are formed to have an identical spectral distribution and have substantially the same fields of view, and a third image which is formed to have a spectral distribution different from the first and second images, and has substantially the same field of view as the first and second images, and the image processing means corrects the position of the third image on the basis of a change in spacing between the first and second images and then forms a composite image signal based on the first, second, and third images during processing of the output signal. Hence, the following effects are obtained.

(7) A method suitable for correcting misregistration based on the output itself of a solid-state image sensing element can be obtained. Hence, with this arrangement, neither a temperature sensor nor a distance measurement device are required.

(8) This results in size and cost reductions of the camera.

(9) In addition, when misregistration is detected for respective pixels by, e.g., area-based matching, and different misregistration correction schemes are adopted for respective pixels or small regions, a high-resolution image of even an object with a depth, which has various distances, can be obtained over the entire frame.

Moreover, in an image sensing apparatus which has an image sensing element having first and second image sensing areas with nearly the same sizes on a single plane, a photographing optical system for respectively forming first and second object images on the first and second image sensing areas, and image processing means, each of the first and second image sensing areas has a matrix of a plurality of pixels arranged at a pitch a in the horizontal direction and a pitch b in the vertical direction on a light-receiving surface, the first and second image sensing areas have a positional relationship in which the first and second image sensing areas are separated a×h×c in the horizontal direction and b×c in the vertical direction (where h is a positive integer), the image sensing element forms first and second images which are formed to have an identical spectral distribution and have substantially the same fields of view, and the image processing means generates a composite image signal based on the first and second images. Hence, the following effect can be obtained.

(10) A layout of image sensing areas, which allows to correct misregistration caused by a change in temperature or a change in object distance using very simple arithmetic operations, can be obtained.

In addition, since a change in spacing between the first and second images is corrected during processing of the output signal, and a composite image signal is formed based on the first and second images, the following effect can be obtained.

(11) Using the layout of image sensing areas, which allows to correct misregistration using very simple arithmetic operations, a very high-resolution video signal can be formed.

As described above, according to the above embodiments, misregistration among R, G, and B images can be satisfactorily corrected, and these images can be composited.

The present invention is not limited to the above embodiments and various changes and modifications can be made within the spirit and scope of the present invention. Therefore, to apprise the public of the scope of the present invention the following claims are made.

What is claimed is:

1. An image sensing apparatus comprising:
a temperature sensor;
a plurality of apertures that receives external light from different positions;
a lens through which light, which passes said plurality of apertures, passes;
a plurality of image sensing units that outputs first and second images formed by the same spectral distribution and a third image formed by a spectral distribution different from the spectral distribution of the first and second images, the first, second and third images being images of the same field of view; and
a signal processing device that forms a signal that outputs an object image by mixing the first, second and third images output from said plurality of image sensing units, wherein upon forming the mixed signal that outputs the object image, said signal processing device corrects a position of the third image based on a position deviation between the first image and the second image caused by at least a thermal expansion of said lens caused by a temperature variation.

2. The apparatus according to claim 1, wherein said signal processing device determines the position deviation state based on an object distance.

3. The apparatus according to claim 2, wherein said signal processing device detects the object distance by comparing image signals from a plurality of image sensing units which extract an identical color component of said plurality of image sensing units.

4. The apparatus according to claim 1, wherein said signal processing device determines the position deviation state in response to setting of a near-distance photographing mode.

5. A method of controlling an image sensing apparatus, which comprises a temperature sensor, a plurality of apertures for receiving external light from different positions, a lens through which light, which passes said plurality of apertures, passes, and a plurality of image sensing units for outputting first and second images formed by the same spectral distribution and a third image formed by a spectral distribution different from the spectral distribution of the first and second images, the first, second and third images being images of the same field of view, comprising the step of:
forming a signal that outputs an object image by mixing the first, second and third images output from said plurality of image sensing units, upon forming the mixed signal that outputs the object image, correcting a position of the third image based on a position deviation between the first image and the second image caused by at least a thermal expansion of said lens caused by a temperature variation.

6. The method according to claim 5, wherein the position deviation state is determined based on an object distance.

7. The method according to claim 6, wherein the object distance is detected by comparing image signals from a plurality of image sensing units which extract an identical color component of said plurality of image sensing units.

8. The method according to claim 5, wherein the position deviation state is determined in response to setting of a near-distance photographing mode.

9. A computer readable medium storing a control program, which when executed by a computer implements a control method for an image sensing apparatus, which comprises a temperature sensor, a plurality of apertures for receiving external light from different positions, a lens through which light, which passes said plurality of apertures, passes, and a plurality of image sensing units for outputting first and second images formed by the same spectral distribution and a third image formed by a spectral distribution different from the spectral distribution of the first and second images, the first, second and third images being images of the same field of view, the control method comprising:

forming a signal that outputs an object image by mixing the first, second and third images output from said plurality of image sensing units, upon forming the mixed signal that outputs the object image, correcting a position of the third image based on a position deviation between the first image and the second image caused by at least a thermal expansion of said lens caused by a temperature variation.

10. The computer readable medium according to claim 9, wherein the position deviation state is determined based on an object distance.

11. The computer readable medium according to claim 10, wherein the object distance is detected by comparing image signals from a plurality of image sensing units which extract an identical color component of said plurality of image sensing units.

12. The computer readable medium according to claim 9, wherein the position deviation state is determined in response to setting of a near-distance photographing mode.

* * * * *